(12) United States Patent
Lo et al.

(10) Patent No.: US 9,083,300 B2
(45) Date of Patent: Jul. 14, 2015

(54) ELECTROMECHANICAL SYSTEMS PIEZOELECTRIC CONTOUR MODE DIFFERENTIAL RESONATORS AND FILTERS

(75) Inventors: Chi Shun Lo, San Diego, CA (US); Jonghae Kim, San Diego, CA (US); Sang-June Park, San Diego, CA (US); Sanghoon Joo, Sunnyvale, CA (US); Chengjie Zuo, San Diego, CA (US); Changhan Yun, San Diego, CA (US)

(73) Assignee: QUALCOMM MEMS Technologies, Inc., San Diego, CA (US)

( * ) Notice: Subject to any disclaimer, the term of this patent is extended or adjusted under 35 U.S.C. 154(b) by 607 days.

(21) Appl. No.: 13/094,707

(22) Filed: Apr. 26, 2011

(65) Prior Publication Data

US 2012/0050236 A1 Mar. 1, 2012

Related U.S. Application Data

(60) Provisional application No. 61/402,687, filed on Sep. 1, 2010.

(51) Int. Cl.
*H03H 9/70* (2006.01)
*H03H 9/00* (2006.01)
(Continued)

(52) U.S. Cl.
CPC ............ *H03H 9/0095* (2013.01); *G09G 3/3493* (2013.01); *H01P 1/2135* (2013.01);
(Continued)

(58) Field of Classification Search
CPC ............ H03H 9/0095; H03H 9/02228; H03H 9/02062; H03H 9/564; H03H 9/0014; H03H 9/133; H03H 9/462; H03H 9/54; H03H 2003/027; H03H 2009/02496; H03H 2009/02503; H03H 2009/15; H03H 2009/155; H03H 2009/02527; H01P 1/2135; G09G 3/3493; G09G 2310/027; G09G 2310/0267

USPC .......... 333/133, 186–189; 310/321, 323, 328, 310/365, 366
See application file for complete search history.

(56) References Cited

U.S. PATENT DOCUMENTS 3,222,622 A 12/1965 Curran et al. ................. 333/192
3,944,951 A 3/1976 Kurth ........................... 333/192
(Continued)

FOREIGN PATENT DOCUMENTS

| EP | 1871007 A1 | 12/2007 |
|---|---|---|
| WO | WO2010077311 A1 | 7/2010 |
| WO | 2012/030727 | 3/2012 |

OTHER PUBLICATIONS

C.Zou et al.; "Channel-Select RF MEMS Filters Based on Self-Coupled AlN Contour-Mode Piezoelectric Resonators"; 2007 IEEE Ultrasonics Symposium; Oct. 28-31, 2007, pp. 1156-1159.*

(Continued)

*Primary Examiner* — Barbara Summons
(74) *Attorney, Agent, or Firm* — Weaver Austin Villeneuve & Sampson LLP

(57) ABSTRACT

This disclosure provides implementations of electromechanical systems resonator structures, devices, apparatus, systems, and related processes. In one aspect, a contour mode resonator device includes a first conductive layer with a plurality of first layer electrodes including a first electrode at which a first input signal can be provided and a second electrode at which a first output signal can be provided. A second conductive layer includes a plurality of second layer electrodes including a first electrode proximate the first electrode of the first conductive layer and a second electrode proximate the second electrode of the first conductive layer. A second signal can be provided at the first electrode or the second electrode of the second conductive layer to cooperate with the first input signal or the first output signal to define a differential signal. A piezoelectric layer is disposed between the first conductive layer and the second conductive layer. The piezoelectric layer includes a piezoelectric material. The piezoelectric layer is substantially oriented in a plane and capable of movement in the plane responsive to an electric field between the first electrodes or the second electrodes.

29 Claims, 19 Drawing Sheets

(51) Int. Cl.
| | |
|---|---|
| H01P 1/213 | (2006.01) |
| H03H 9/02 | (2006.01) |
| H03H 9/24 | (2006.01) |
| H03H 9/56 | (2006.01) |
| G09G 3/34 | (2006.01) |
| H03H 3/02 | (2006.01) |

(52) U.S. Cl.
CPC ......... *H03H9/0014* (2013.01); *H03H 9/02228* (2013.01); *H03H 9/2431* (2013.01); *H03H 9/2436* (2013.01); *H03H 9/2463* (2013.01); *H03H 9/564* (2013.01); *G09G 2310/027* (2013.01); *G09G 2310/0267* (2013.01); *H03H 2003/027* (2013.01); *H03H 2009/02496* (2013.01); *H03H 2009/02527* (2013.01); *H03H 2009/241* (2013.01)

(56) References Cited

U.S. PATENT DOCUMENTS

| | | | | |
|---|---|---|---|---|
| 5,365,138 | A * | 11/1994 | Saw et al. | 310/313 D |
| 5,365,207 | A | 11/1994 | Borras et al. | 333/196 |
| 6,545,394 | B2 * | 4/2003 | Kawashima | 310/361 |
| 6,734,600 | B2 * | 5/2004 | Aigner et al. | 310/313 B |
| 7,102,460 | B2 * | 9/2006 | Schmidhammer et al. | 333/133 |
| 7,446,629 | B2 * | 11/2008 | Nakamura et al. | 333/133 |
| 7,550,904 | B2 * | 6/2009 | Kawakubo et al. | 310/365 |
| 2006/0091978 | A1 | 5/2006 | Wang et al. | 333/189 |
| 2006/0290449 | A1 | 12/2006 | Piazza et al. | 333/187 |
| 2007/0252485 | A1 | 11/2007 | Kawakubo et al. | |
| 2008/0048804 | A1 * | 2/2008 | Volatier et al. | 333/191 |
| 2008/0297277 | A1 * | 12/2008 | Meister et al. | 333/189 |
| 2010/0039000 | A1 | 2/2010 | Milson et al. | |
| 2010/0181868 | A1 | 7/2010 | Gaidarzhy et al. | 310/313 B |
| 2011/0012696 | A1 * | 1/2011 | Skarp | 333/195 |

OTHER PUBLICATIONS

P.J. Stephanou et al.; "GHz Contour Extentional Mode Aluminum Nitride MEMS Resonators"; 2006 IEEE Ultrasonics Symposium; Oct. 2-6, 2006, pp. 2401-2404.*

G. Piazza et al.; "One and Two Port Piezoelectric Higher Order Contour-Mode Mems Resonators for Mechanical Signal Processing"; Solid-State Electronics 51 (2007) pp. 1596-1608, published by Elsevier Ltd. © 2007 and available online at www.science direct.com.*

J.H. Kuypers et al.; "Intrinsic Temperature Compensation of Aluminum Nitride Lamb Wave Resonators for Multiple-Frequency References"; published in 2008 IEEE International Frequency Control Symposium, May 19-21, 2008, pp. 240-249.*

Piazza, Gianluca, "One and Two Port Piezoelectric Higher Order ContourMode MEMS Resonators for Mechanical Signal Processing," (Dec. 2007), Published in Solid State Electronics, vol. 51, Issues 11-12, 1596-1608.

International Search Report—PCT/US2011/049568—ISA/EPO—Nov. 29, 2011.

Written Opinion of the International Preliminary Examining Authority—PCT/US2011/049568—ISA/EPO—Aug. 3, 2012.

Zuo C., et al., "1.05-GHz CMOS Oscillator Based on Lateral-Field-Excited Piezoelectric AIN Contour-Mode MEMS Resonators" IEEE Transactions on Ultrasonics, Ferroelectrics, and Frequency Control 57.1 (2010): 82-87.

Zuo C., et al., "Single-ended-to-differential and differential-todifferential Channel-select filters based on Piezoelectric AIN Contour-mod MEMS Resonators",Frequency Control Symposium (FCS), 2010 IEEE International, IEEE, Piscataway, NJ, USA, Jun. 1, 2010, pp. 5-8, XP031738571.

* cited by examiner

ELECTROMECHANICAL SYSTEMS PIEZOELECTRIC CONTOUR MODE DIFFERENTIAL RESONATORS AND FILTERS

CROSS-REFERENCE TO RELATED APPLICATION

This disclosure claims priority to U.S. Provisional Patent Application No. 61/402,687, filed Sep. 1, 2010, entitled "PIEZOELECTRIC CONTOUR MODE DIFFERENTIAL MEMS RESONATOR AND FILTER", and assigned to the assignee hereof. The disclosure of the prior application is considered part of, and is incorporated by reference in, this disclosure.

TECHNICAL FIELD

This disclosure relates generally to resonators and more specifically to electromechanical systems piezoelectric resonators.

DESCRIPTION OF THE RELATED TECHNOLOGY

Electromechanical systems include devices having electrical and mechanical elements, transducers such as actuators and sensors, optical components (e.g., mirrors), and electronics. Electromechanical systems can be manufactured at a variety of scales including, but not limited to, microscales and nanoscales. For example, microelectromechanical systems (MEMS) devices can include structures having sizes ranging from about one micron to hundreds of microns or more. Nanoelectromechanical systems (NEMS) devices can include structures having sizes smaller than one micron including, for example, sizes smaller than several hundred nanometers. Electromechanical elements may be created using deposition, etching, lithography, and/or other micromachining processes that etch away parts of substrates and/or deposited material layers, or that add layers to form electrical, mechanical, and electromechanical devices.

One type of electromechanical systems device is called an interferometric modulator (IMOD). As used herein, the term interferometric modulator or interferometric light modulator refers to a device that selectively absorbs and/or reflects light using the principles of optical interference. In some implementations, an interferometric modulator may include a pair of conductive plates, one or both of which may be transparent and/or reflective, wholly or in part, and capable of relative motion upon application of an appropriate electrical signal. In an implementation, one plate may include a stationary layer deposited on a substrate and the other plate may include a metallic membrane separated from the stationary layer by an air gap. The position of one plate in relation to another can change the optical interference of light incident on the interferometric modulator. Interferometric modulator devices have a wide range of applications, and are anticipated to be used in improving existing products and creating new products, especially those with display capabilities.

Various electronic components and circuits can be implemented at the electromechanical systems level. However, conventional electromechanical systems filters have limitations. For example, conventional thickness MEMS filters, such as thickness-extensional mode resonators, are limited to single-frequency operation on a single wafer. Conventional quartz crystal resonators and Surface Acoustic Wave (SAW) filters are often bulky and located off-chip.

Modern wireless communications systems often specify miniaturized, low-cost, low-power, low-impedance, on-chip and high quality (Q) resonators to be employed in front-end radio frequency (RF) filters or as frequency references. Conventional resonators have high motional impedances that make their interface with lower impedance, e.g. 50Ω, RF systems troublesome. Film Bulk Acoustic Resonator (FBAR) technology has been used, however, the fundamental frequency of these FBAR devices is set by the piezoelectric film thickness, presenting an inherent challenge in the manufacturing of FBARs to meet wireless communications system specifications. On one hand, in order to obtain reasonable yields, a thickness tolerance of about 0.1% is needed. On the other hand, multiple frequency selective arrays of resonators cannot readily be fabricated on a single chip, due to the fact that the frequency of vibration for the devices is set by the film thickness.

SUMMARY

The structures, devices, apparatus, systems, and processes of the disclosure each have several innovative aspects, no single one of which is solely responsible for the desirable attributes disclosed herein.

Disclosed are implementations of electromechanical systems resonator structures, such as contour mode resonators (CMR), devices, apparatus, systems, and related fabrication processes.

According to one innovative aspect of the subject matter described in this disclosure, a contour mode resonator structure includes a first conductive layer with a plurality of first layer electrodes including a first electrode at which a first input signal can be provided and a second electrode at which a first output signal can be provided. A second conductive layer includes a plurality of second layer electrodes including a first electrode proximate the first electrode of the first conductive layer and a second electrode proximate the second electrode of the first conductive layer. A second signal can be provided at the first electrode or the second electrode of the second conductive layer to cooperate with the first input signal or the first output signal to define a differential signal. A piezoelectric layer is disposed between the first conductive layer and the second conductive layer. The piezoelectric layer includes a piezoelectric material. The piezoelectric layer is substantially oriented in a plane and capable of movement in the plane responsive to an electric field between the first electrodes or the second electrodes.

In one example, the second signal is a second input signal provided to the first electrode of the second conductive layer, and the differential signal is a differential input signal. The second electrode of the second conductive layer is coupled to ground. In another example, the second signal is a second output signal capable of being output at the second electrode of the second conductive layer, and the differential signal is a differential output signal. The first electrode of the second conductive layer is coupled to ground. In yet another example, a second input signal can be provided to the first electrode of the second conductive layer to cooperate with the first input signal to define a differential input signal, and a second output signal is capable of being output at the second electrode of the second conductive layer to cooperate with the first output signal to define a differential output signal.

According to another innovative aspect of the subject matter described in this disclosure, a receiver system includes an antenna configured to receive a wireless signal and output an antenna signal. A contour mode resonator structure includes a first conductive layer with a first electrode coupled to receive the antenna signal and a second electrode at which a first differential output signal can be provided. A second conductive layer includes a first electrode proximate the first electrode of the first conductive layer and a second electrode proximate the second electrode of the first conductive layer at which a second differential output signal can be provided. A piezoelectric layer is disposed between the first conductive layer and the second conductive layer. The piezoelectric layer is substantially oriented in a plane and capable of movement in the plane responsive to an electric field between the first electrodes or the second electrodes. A circuit component is coupled to receive the first differential output signal and the second differential output signal.

According to another innovative aspect of the subject matter described in this disclosure, a transmission system includes a circuit component configured to output a first differential signal and a second differential signal. A contour mode resonator structure includes a first conductive layer with a first electrode coupled to receive the first differential signal and a second electrode at which an output signal can be provided. A second conductive layer includes a first electrode and a second electrode. The first electrode of the second conductive layer is proximate the first electrode of the first conductive layer and coupled to receive the second differential signal. The second electrode is proximate the second electrode of the first conductive layer. A piezoelectric layer is disposed between the first conductive layer and the second conductive layer and substantially oriented in a plane and capable of movement responsive to an electric field between the first electrodes or the second electrodes. An antenna is coupled to receive the output signal and output a wireless signal.

According to another innovative aspect of the subject matter described in this disclosure, a duplexer system includes an antenna. A first contour mode resonator includes a first conductive layer with a plurality of first layer electrodes including a first electrode coupled to receive a first input signal and a second electrode coupled to the antenna. A second conductive layer includes a plurality of second layer electrodes including a first electrode proximate the first electrode of the first conductive layer and a second electrode proximate the second electrode of the first conductive layer. The first electrode of the second conductive layer is coupled to receive a second input signal. The second electrode of the second conductive layer is coupled to ground. A piezoelectric layer is disposed between the first conductive layer and the second conductive layer. A second contour mode resonator includes a first conductive layer with a plurality of first layer electrodes including a first electrode coupled to provide a first output signal and a second electrode coupled to the antenna. A second conductive layer includes a plurality of second layer electrodes including a first electrode proximate the first electrode of the first conductive layer and a second electrode proximate the second electrode of the first conductive layer. The first electrode of the second conductive layer is coupled to provide a second output signal. The second electrode of the second conductive layer is coupled to ground. A piezoelectric layer is disposed between the first conductive layer and the second conductive layer.

According to another innovative aspect of the subject matter described in this disclosure, a duplexer system includes an antenna. A contour mode resonator includes a first conductive layer with a plurality of first layer electrodes including a first electrode coupled to receive a first input signal, a second electrode coupled to the antenna, and a third electrode coupled to provide a first output signal. A second conductive layer includes a plurality of second layer electrodes including a first electrode proximate the first electrode of the first conductive layer, a second electrode proximate the second electrode of the first conductive layer, and a third electrode proximate the third electrode of the first conductive layer. The first electrode of the second conductive layer is coupled to receive a second input signal, the second electrode of the second conductive layer is coupled to ground, and the third electrode is coupled to provide a second output signal. A piezoelectric layer is disposed between the first conductive layer and the second conductive layer.

Details of one or more implementations of the subject matter described in this specification are set forth in the accompanying drawings and the description below. Other features, aspects, and advantages will become apparent from the description, the drawings, and the claims. Note that the relative dimensions of the following figures may not be drawn to scale.

BRIEF DESCRIPTION OF THE DRAWINGS

The included drawings are for illustrative purposes and serve only to provide examples of possible structures and configurations of the disclosed resonator structures, devices, apparatus, systems, and related processes.

Like reference numbers and designations in the various drawings indicate like elements.

DETAILED DESCRIPTION

Figure 1:
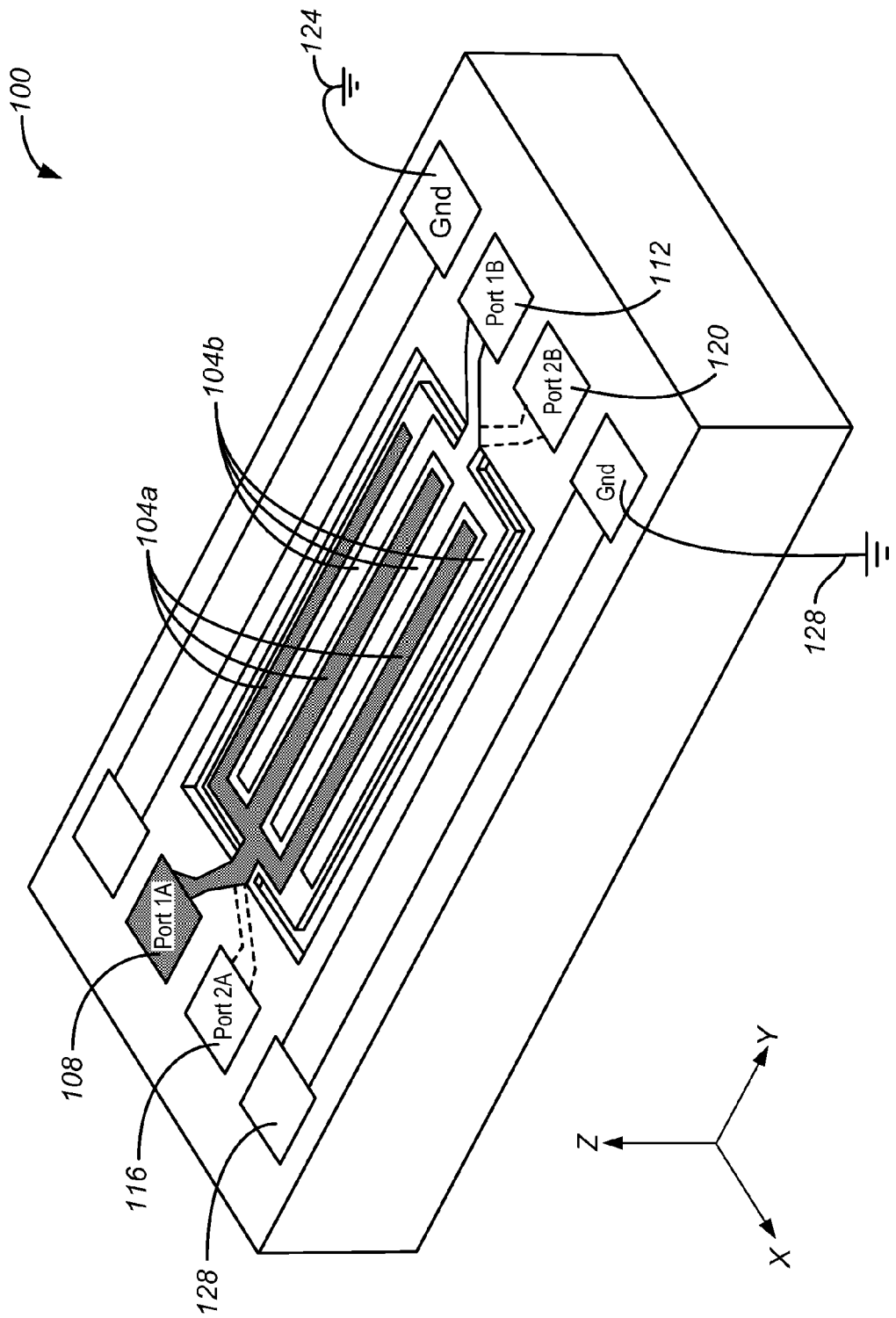
FIG. 1 shows an example of a perspective view of a contour mode resonator (CMR) device in accordance with one implementation.

The following detailed description is directed to certain implementations for the purposes of describing the innovative aspects. However, the teachings herein can be applied in a multitude of different ways. The described implementations may be implemented in any device that is configured to display an image, whether in motion (e.g., video) or stationary (e.g., still image), and whether textual, graphical or pictorial. More particularly, it is contemplated that the implementations may be implemented in or associated with a variety of electronic devices such as, but not limited to, mobile telephones, multimedia Internet enabled cellular telephones, mobile television receivers, wireless devices, smartphones, bluetooth devices, personal data assistants (PDAs), wireless electronic mail receivers, hand-held or portable computers, netbooks, notebooks, smartbooks, printers, copiers, scanners, facsimile devices, GPS receivers/navigators, cameras, MP3 players, camcorders, game consoles, wrist watches, clocks, calculators, television monitors, flat panel displays, electronic reading devices (e.g., e-readers), computer monitors, auto displays (e.g., odometer display, etc.), cockpit controls and/or displays, camera view displays (e.g., display of a rear view camera in a vehicle), electronic photographs, electronic billboards or signs, projectors, architectural structures, microwaves, refrigerators, stereo systems, cassette recorders or players, DVD players, CD players, VCRs, radios, portable memory chips, washers, dryers, washer/dryers, packaging (e.g., MEMS and non-MEMS), aesthetic structures (e.g., display of images on a piece of jewelry) and a variety of electromechanical systems devices. The teachings herein also can be used in non-display applications such as, but not limited to, electronic switching devices, radio frequency filters, sensors, accelerometers, gyroscopes, motion-sensing devices, magnetometers, inertial components for consumer electronics, parts of consumer electronics products, varactors, liquid crystal devices, electrophoretic devices, drive schemes, manufacturing processes, electronic test equipment. Thus, the teachings are not intended to be limited to the implementations depicted solely in the figures, but instead have wide applicability as will be readily apparent to one having ordinary skill in the art.

The disclosed implementations include examples of structures and configurations of electromechanical systems resonator devices, such as contour mode resonators (CMR). Related apparatus, systems, and fabrication processes and techniques are also disclosed. CMRs are referred to as "contour mode" because of their substantially in-plane mode of vibration, as described in greater detail below. In the case of piezoelectric resonators, an electric field applied between electrodes is transduced into a mechanical strain in a piezoelectric material. Thus, a time-varying electrical signal can be provided to an input electrode of the CMR and transduced to a corresponding time-varying mechanical motion. A portion of this mechanical energy can be transferred back to electrical energy at the input electrode or at a separate output electrode. The input and output electrodes are generally disposed in contact with or in proximity to the piezoelectric material. For instance, the electrodes can be located on the same surface or on opposite surfaces of a layer of the piezoelectric material. The frequency of the input electrical signal that produces the greatest substantial amplification of the mechanical displacement amplitude in the piezoelectric material is generally referred to as a resonant frequency of the CMR.

In one or more implementations of the disclosed CMRs, the resonator structure is suspended in a cavity and generally includes two conductive electrode layers, with a layer of piezoelectric material sandwiched between the two electrode layers. The resonator structure can be suspended in the cavity by specially designed tethers, which are often fabricated in the same layer stack of the resonator structure itself. The resonator structure is acoustically isolated from surrounding structural support and apparatus by virtue of the cavity.

The disclosed CMRs are structured and configured for differential signaling, for instance, when the CMR is incorporated into a differential filter. These CMRs can serve as building blocks in wireless communication circuits and components such as filters, oscillators, and frequency reference sources. Implementations described in the present application include: a fully differential filter, providing for a pair of differential inputs and a pair of differential outputs; a single ended to differential filter, with a single input and a pair of differential outputs; a differential to single ended filter, with a pair of differential inputs and a single output; and combinations thereof. The CMRs described herein can be incorporated in various devices, such as chip components, in which differential signaling is desired. For example, such CMRs can be incorporated as part of a receiver, a transmitter, or a duplexer for analog signal processing. One example of an application is a radio frequency (RF) section of a wireless device. Some implementations disclosed herein cooperate with the antenna of a wireless device, in which differential to single ended transformations and vice versa are desired.

Particular implementations of the subject matter described in this disclosure can be implemented to realize one or more of the following potential advantages. Some implementations described herein are based on a contour mode resonator configuration. In such implementations, the resonant frequency of a CMR can be substantially controlled by engineering the lateral dimensions of the piezoelectric material and electrodes. One benefit of such a construction is that multi-frequency RF filters, clock oscillators, transducers or other devices, each including one or more CMRs depending on the desired implementation, can be fabricated on the same substrate. For example, this may be advantageous in terms of cost and size by enabling compact, multi-band filter solutions for RF front-end applications on a single chip. By co-fabricating multiple CMRs, each with different finger widths, as described in greater detail below, multiple frequencies can be addressed on the same die. Arrays of CMRs with different frequencies spanning a range from MHz to GHz can be fabricated on the same substrate.

With the disclosed CMRs, direct frequency synthesis for spread spectrum communication systems may be enabled by multi-frequency narrowband filter banks including high quality (Q) resonators, without the need for phase locked loops. The disclosed CMR implementations can provide for piezoelectric transduction with low motional resistance while maintaining high Q factors and appropriate reactance values that facilitate their interface with contemporary circuitry. Some examples of the disclosed laterally vibrating resonator microstructures provide the advantages of compact size, e.g., on the order of 100 um (micrometers) in length and/or width, low power consumption, and compatibility with high-yield mass-producible components.

The disclosed resonator structures can be fabricated on a low-cost, high-performance, large-area insulating substrate or panel. In some implementations, the insulating substrate on which the disclosed resonator structures are formed can be made of display grade glass (alkaline earth boro-aluminosilicate) or soda lime glass. Other suitable insulating materials include silicate glasses, such as alkaline earth aluminosilicate, borosilicate, modified borosilicate, and others. Also, ceramic materials, such as AlOx, $Y_2O_3$, BN, SiC, AlNx, and GaNx can be used as the insulating substrate material. In other implementations, the insulating substrate is formed of a high-resistivity silicon substrate. SOI substrates, GaAs substrates, InP substrates, and plastic (PEN or PET) substrates, e.g., associated with flexible electronics, can also be used. The substrate can be in conventional IC wafer form, e.g., 4-inch, 6-inch, 8-inch, 12-inch, or in large-area panel form. For example, flat panel display substrates that have dimensions such as 370 mm×470 mm, 920 mm×730 mm, and 2850 mm×3050 mm, can be used.

In some implementations, the structures are fabricated by depositing a sacrificial (SAC) layer on the substrate; forming a lower electrode layer on the SAC layer; depositing a piezoelectric layer on the lower electrode layer; forming an upper electrode layer on the piezoelectric layer; and removing at least part of the SAC layer to define a cavity. The resulting resonator cavity separates at least a portion of the lower electrode layer from the substrate and provides voids along the sides of the resonator structure, as illustrated in the accompanying figures, to allow the resonator to vibrate and move in one or more directions with substantial elastic isolation from the remaining substrate. In other implementations, a portion of the substrate itself serves as a SAC material. In these implementations, designated regions of the insulating substrate below the resonator structure can be removed, for example, by etching to define the cavity.

While the present disclosure is described with reference to a few specific implementations, the description and specific implementations are merely illustrative and are not to be construed as limiting. Various modifications can be made to the described implementations without departing from the true spirit and scope as defined by the appended claims. For example, the blocks of processes shown and described herein are not necessarily performed in the order indicated. It should also be understood that the processes may include more or fewer blocks than are indicated. In some implementations, blocks described herein as separate blocks may be combined, such as sequential depositing and patterning blocks to form a particular layer. Conversely, what may be described herein as a single block may be implemented in multiple blocks.

Similarly, device functionality may be apportioned by grouping or dividing tasks in any convenient fashion. For example, when blocks are described herein as being performed by a single device (e.g., by a single logic device), the blocks may alternatively be performed by multiple devices and vice versa. Moreover, the specific components, parameters, and numerical values described herein are provided merely by way of example and are in no way limiting. The drawings referenced herein are not necessarily drawn to scale.

FIG. 1 shows an example of a perspective view of a CMR device. In FIG. 1, a CMR structure 100 includes an upper conductive layer of electrodes 104a and 104b. The first electrodes 104a are connected to a first input port 108, referred to as "Port 1A." The second electrodes 104b are connected to a first output port 112, referred to as "Port 1B." A lower conductive layer of electrodes is situated underneath the upper conductive layer on the opposite side of a sandwiched piezoelectric layer, as described below. In one example, the lower conductive layer includes a similar arrangement of first electrodes underlying the first electrodes 104a of the upper conductive layer and connected to a port 116, referred to as "Port 2A," and a similar arrangement of second electrodes underlying the second electrodes 104b of the upper conductive layer and connected to a port 120, referred to as "Port 2B." Ports 116 and 120 can be configured as a second input port and a second output port, respectively, in one implementation.

In FIG. 1, as further described below, the ports 108-120 can have different configurations. For instance, Ports 2A and 2B can be coupled to ground 124 and/or ground 128, thus grounding the lower conductive layer of electrodes, while an input electrical signal can be provided to Port 1A, resulting in an output electrical signal being provided to port 1B. In another configuration, a first input signal can be provided to Port 1A, and a second input signal can be provided to Port 2A, responsive to which a first output signal can be delivered to Port 1B, and a second output signal can be delivered to Port 2B. The piezoelectric layer is disposed between the upper conductive layer and the lower conductive layer to translate the input signal(s) to mechanical vibration, which is then translated to the output signal(s).

In the example of FIG. 1, the electrodes in the respective conductive layers have longitudinal axes substantially oriented along a Y axis, illustrated in FIG. 1. The X, Y, and Z axes of FIG. 1 and additional figures described below are provided for reference and illustrative purposes only. In this example, the electrodes are generally straight along their longitudinal axes. Thus, in such examples, the electrodes are sometimes referred to herein as "fingers."

Figure 2A:
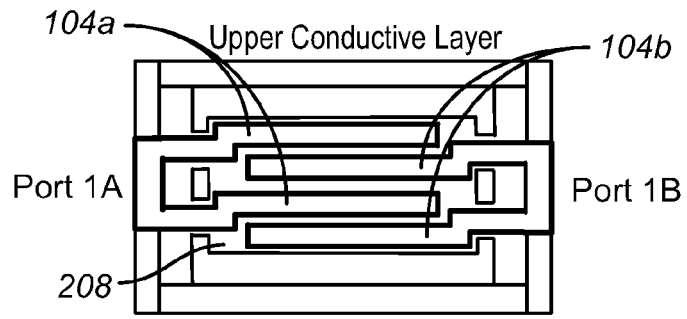
FIG. 2A shows an example of a top view of a CMR device in accordance with one implementation.
Figure 2B:
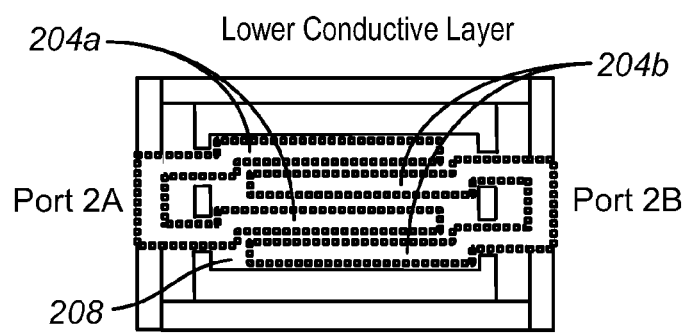
FIG. 2B shows an example of a bottom view of the CMR device of FIG. 2A.
Figure 2C:
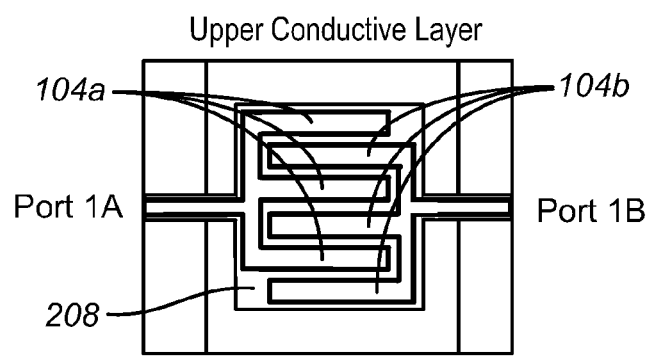
FIG. 2C shows an example of a top view of a CMR device in accordance with another implementation.
Figure 2D:
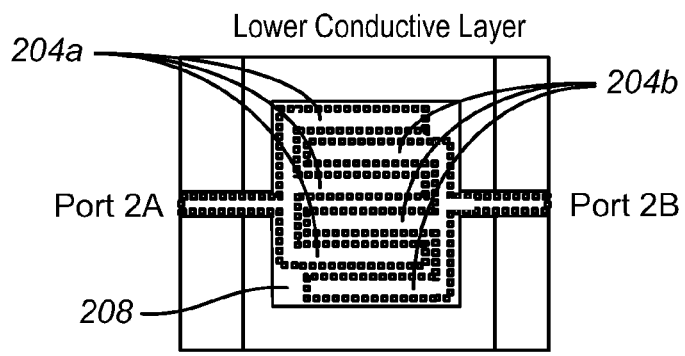
FIG. 2D shows an example of a bottom view of the CMR device of FIG. 2C.

FIG. 2A shows an example of a top view of a CMR device in accordance with one implementation. In FIG. 2A, the first electrodes 104a are interdigitated with second electrodes 104b in the upper conductive layer, like the arrangement in FIG. 1. Similarly, as shown in the bottom view of the CMR device in FIG. 2B, the lower conductive layer includes a corresponding arrangement of first electrodes 204a interdigitated with second electrodes 204b. FIGS. 2C and 2D show examples of top and bottom views of an alternative construction of a CMR device in accordance with another implementation. FIGS. 2C and 2D show that there can be additional first and second electrodes in the respective conductive layers, and the electrodes can have different lengths, widths, and spacings from those in FIGS. 2A and 2B. In the examples of FIGS. 2A-2D, the electrodes in the respective conductive layers are situated in a periodic arrangement and spaced apart from one another, for example, along the X axis of FIG. 1. In some examples, the first electrodes 104a and 204a of the respective conductive layers are aligned with one another, that is, along the Z axis of FIG. 1, while separated by piezoelectric layer 208. In such instances, the same can be true for second electrodes 104b and 204b.

Figure 3:
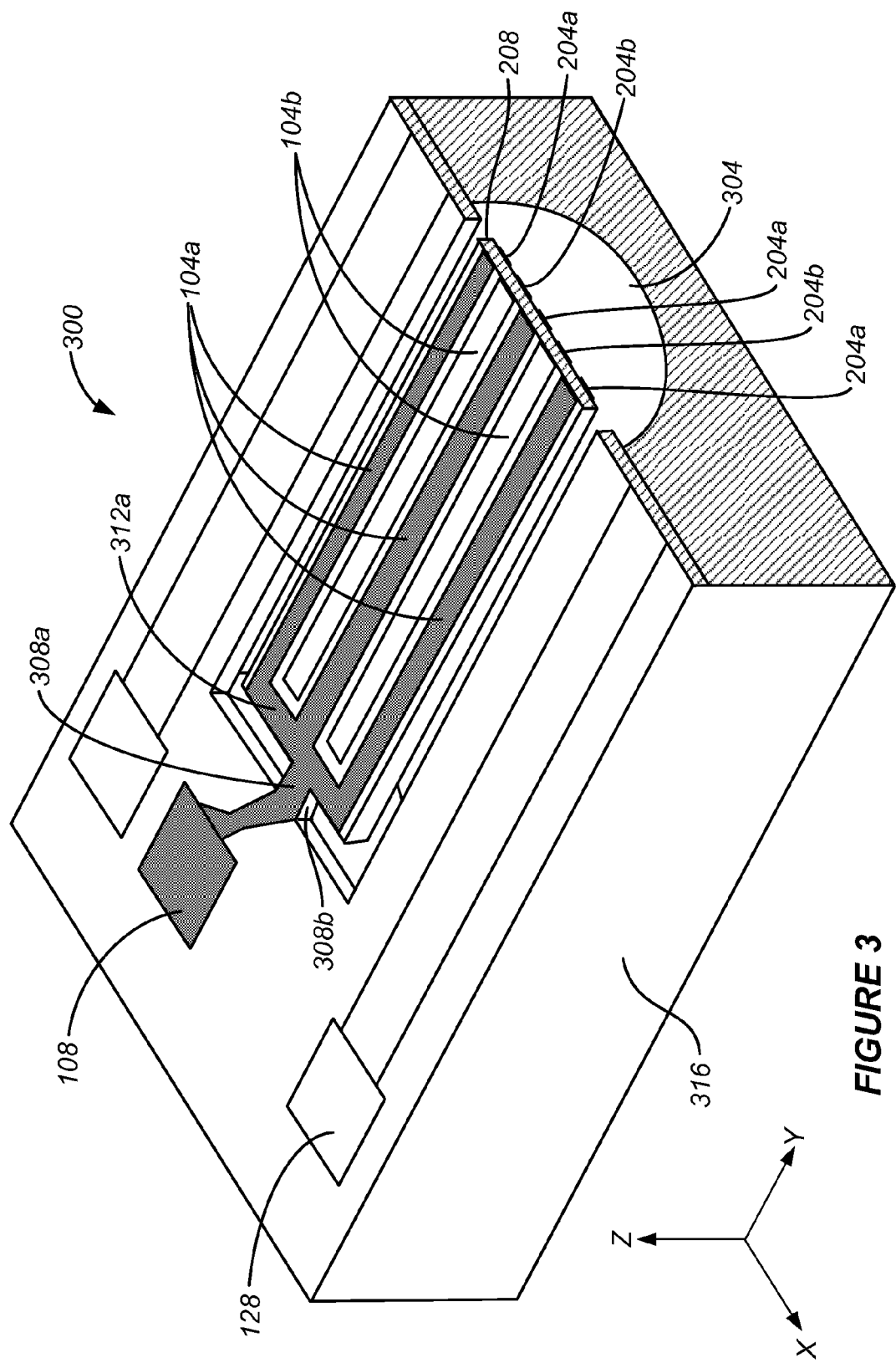
FIG. 3 shows an example of a perspective cross-sectional view of a CMR device in accordance with one implementation.

FIG. 3 shows an example of a perspective cross-sectional view of a CMR device. In FIG. 3, a resonator structure 300 includes an upper conductive layer of electrodes 104a and 104b, piezoelectric layer 208, and lower conductive layer of electrodes 204a and 204b, as described above. Resonator structure 300 is suspended in a cavity 304 by virtue of tether 308a and tether 308b, as well as a matching pair of tethers (not shown) connected at the opposite end of the CMR. In FIG. 3, the tethers serve as physical anchors to hold the resonator structure in the cavity. The resonator structure is capable of lateral motion of the piezoelectric material, that is, with respect to a plane oriented along the X and Y axes. Tether 308a is electrically coupled between first electrodes 104a of the upper conductive layer and port 108, while tether 308b is electrically coupled between underlying first electrodes 204a of the lower conductive layer and another port, such as port 116 of FIG. 1. The matching pair of tethers on the opposite end of the structure can similarly electrically couple second electrodes 104b and 204b of the upper and lower layers to their respective ports as described in the example of FIG. 1 above. The tethers can be fabricated as extensions of their respective conductive layers and can be on the order of several microns wide, e.g., along the X axis. In one example, the tethers are designed such that their length, e.g., along the Y axis of FIG. 1, is an integer number of resonant quarter wavelengths.

In FIGS. 2C, 2D, and FIG. 3, in the examples shown, each set of electrodes has an interconnect electrically coupled to a respective tether. For instance, in FIG. 3, interconnect 312a is coupled between first electrodes 104a and tether 308a. Thus, in some implementations, tether 308a, electrically coupled interconnect 312a, and first electrodes 104a form an integral part of the upper conductive layer. Another part of the upper conductive layer includes a corresponding tether and interconnect coupled to second electrodes 104b. The resonator structure is partially surrounded by an opening in the form of cavity 304 and is coupled to supporting structure or substrate 316, which supports the resonator structure, by virtue of the tethers.

In FIGS. 1-3, the resonator structures can include a pattern of metal electrodes in the upper and lower conductive layers that, when provided one or more electrical input signals, causes the piezoelectric layer to have a motional response. The motional response includes a vibrational oscillation along one or more of the X, Y, and Z axes. The resonant frequency response of the CMR structure can be controlled according to a periodic arrangement of electrodes in the conductive layers, for instance, by adjusting the width(s) as well as the spacing(s) of the electrodes from one another in a conductive layer, e.g., along the X axis of FIG. 1.

In FIGS. 1-3, the pattern of interdigitated first electrodes and second electrodes of a conductive layer is periodic in one direction, for instance, along the X axis of FIG. 1. As illustrated, the periodic arrangement of electrodes 104a and 104b includes alternating areas of metal and spaces (areas without metal). In various implementations, the areas of metal and the spaces have the same width, the areas of metal are wider than the spaces, the areas of metal are narrower than the spaces, or any other appropriate relation between the metal widths and spaces. The finger width of the CMR, a parameter that is based on a combination of electrode width and spacing, as described in greater detail below with reference to FIG. 4, can be adjusted to control one or more resonant frequencies of the structure. For instance, a first finger width in a conductive layer can correspond to a first resonant frequency of the CMR, and a second finger width in the conductive layer can provide a different second resonant frequency of the CMR.

The CMR structure can be driven into resonance by applying a harmonic electric potential that varies in time across the patterned conductive layers. The layout and interconnectivity of the periodic electrodes transduce the desired mode of vibration while suppressing the response of undesired spurious modes of vibration of the structure. For example, a specific higher order vibrational mode can be transduced without substantially transducing other modes. Compared to its response to a constant DC electric potential, the amplitude of the mechanical response of the resonator is multiplied by the Q factor (the typical Q factor is on the order of 500 to 5000). Engineering the total width of the resonator structure and the number of electrode periods provides control over the impedance of the resonator structure by scaling the amount of charge generated by the motion of the piezoelectric material.

Figure 4:
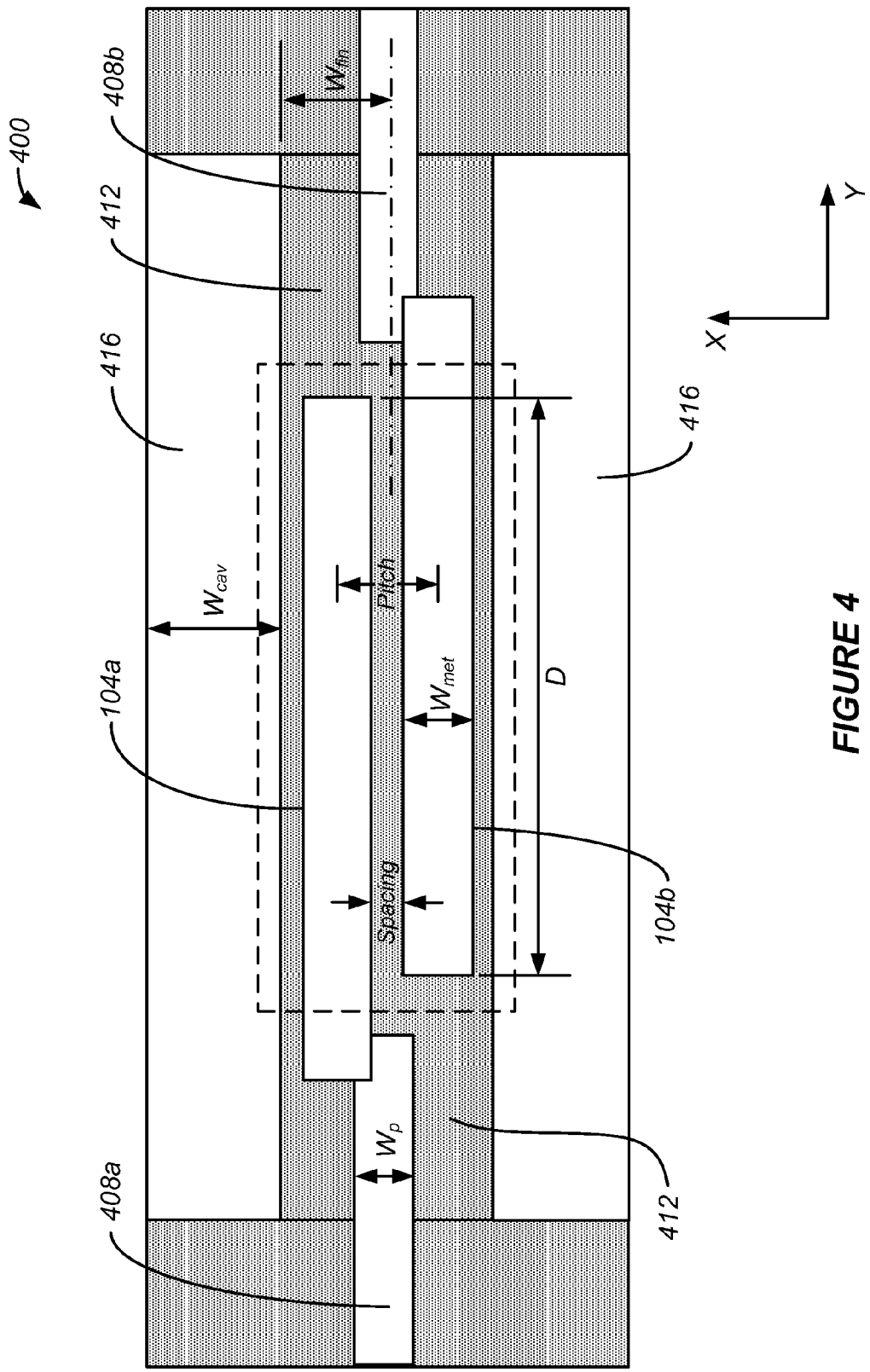
FIG. 4 shows an example of a top view of a resonator device in accordance with one implementation.

FIG. 4 shows an example of a top view of a resonator device in accordance with one implementation. In the implementation of FIG. 4, a resonator structure 400 is configured as a CMR, with the electrodes in the respective conductive layers having longitudinal axes substantially parallel to one another and extending along the Y axis, as illustrated. A resonator structure generally has a finger width, Wfin, representing the width of each sub-resonator, which primarily includes one electrode and half of the width of the exposed piezoelectric material on either side of the one electrode along the X axis, for example, as shown in FIG. 4. The electrode width, that is, the width of an individual electrode, Wmet, is generally smaller than the finger width, to limit the feed-through capacitance between electrodes. The pitch of the resonator structure generally refers to the distance between mid-points of electrodes along the X axis, as shown in FIG. 4. The spacing of electrodes refers to the gap between the edges of adjacent electrodes along the X axis, as shown in FIG. 4. The resonant frequency of the resonator structures disclosed herein is primarily determined by the finger width or pitch. The electrode width and spacing have second-order effects on the frequency. The finger width and pitch are correlated with the electrode width and spacing parameters, by definition. Pitch is often equal to finger width, as shown in FIG. 4.

In FIG. 4, in one example, the upper electrodes 104a and 104b have an electrode width along the X axis, Wmet, of 4.8 um. Connecting members 408a and 408b, which can include tethers in one example, are coupled to the respective electrodes 104a and 104b. The connecting members 408a and 408b have a connecting member width, Wp, which can be smaller than Wmet in this example. In other instances, Wp is the same size or larger than Wmet, depending on the desired configuration. The finger width of the electrodes, Wfin, which corresponds to the half-width of the piezoelectric layer 412 in this example, is 6.4 um. Wcav, the cavity width of cavity 416 along the X axis can be an integer multiple of Wfin, such as 2*Wfin (e.g., 12.8 um) or other measurement. Thus, in this instance, Wcav is approximately the same as the full piezoelectric layer width. In this example, a distance D, in which the upper electrodes 104a and 104b are adjacent to one another, can be on the order of 128 um or 256 um, by way of example.

Figure 5:
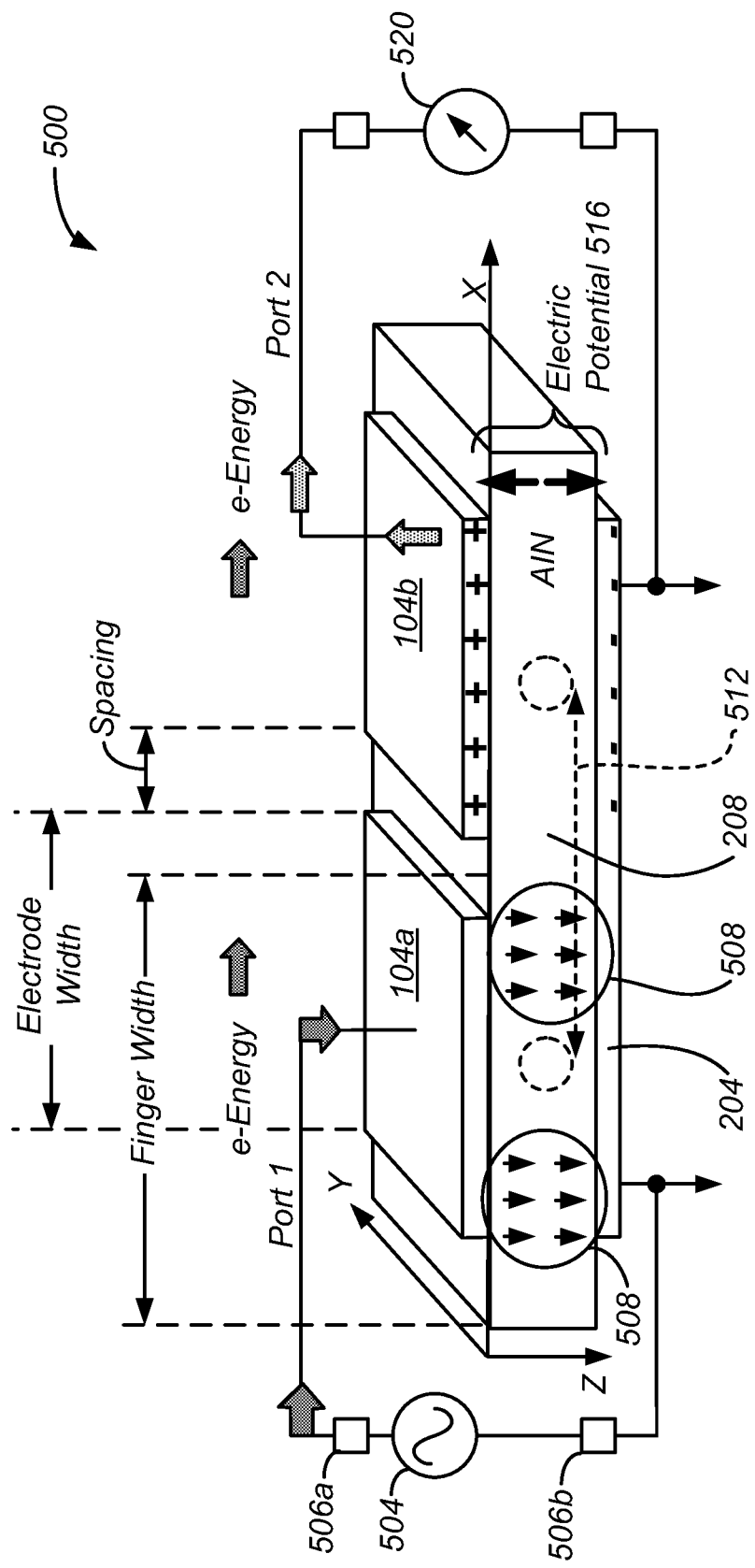
FIG. 5 shows an example of a perspective cross-sectional view of a resonator structure in accordance with one implementation.

FIG. 5 shows an example of a perspective cross-sectional view of a resonator structure. In FIG. 5, the resonator structure 500 includes an upper conductive layer of electrodes 104a and 104b, piezoelectric layer 208, and a lower conductive layer in the form of a single electrode 204, with the layers stacked as described above. In FIG. 5, there is an input port, "Port 1," at which an input electrical signal can be delivered to first electrode 104a of the upper conductive layer. Port 1 can be coupled to receive the input electrical signal from various components, such as an amplifier or an antenna. In the illustration of FIG. 5, an alternating current (AC) current source 504 simulates the electrical signal delivered by such a component. AC current source 504 has a first terminal 506a coupled to Port 1 and a second terminal 506b coupled to the lower electrode 204, which is coupled to ground in this example. In this way, an input AC signal can be provided from current source 504 to Port 1 and, hence, to first electrode 104a of the resonator. This causes an alternating electric field to be applied across the thickness of the piezoelectric layer 208, illustrated by arrows 508 in FIG. 5. The thickness of the structure 500 is generally measured along the Z axis, and the length is measured along the Y axis. The total width, also referred to herein as the width of the structure, finger width, spacing, and electrode width are measured along the X axis, in the example of FIG. 5. The electric field is applied in a manner to transduce mechanical resonance such that piezoelectric layer 208 experiences displacement back and forth along the X, Y, and Z axes. This includes lateral displacement, that is, back and forth along the width and length of the structure, in this example, substantially along the respective X and Y axes of FIG. 5.

FIG. 5 illustrates a two-port structure with second electrode 104b coupled to Port 2, which represents an output port in this configuration. Some of the present CMR implementations leverage the lateral movement substantially back-and-forth along the width of the structure (X axis) as illustrated by arrows 512, although the transduction of energy in other implementations can be based on movement along the length and/or thickness of the structure. One benefit of the disclosed resonators is that the piezoelectric layer 208 can vibrate and move in all dimensions at resonant frequencies, for instances, in planes oriented along the X and Y axes, X and Z axes, and Y and Z axes. In one example of a CMR, the electric field 508 is induced across piezoelectric layer 208 along the Z axis, causing extensional mechanical stress 512 in the piezoelectric layer along the width of the structure through piezoelectric mechanical coupling. This mechanical energy causes an electric potential 516 to be generated across second electrode 104b and lower electrode 204. This transduced potential is sensed as an output electrical signal at Port 2 and can be measured by one or more sensors 520 coupled between Port 2 and grounded lower electrode 204.

The fundamental frequency for the displacement of the piezoelectric layer can be set in part lithographically by the planar dimensions of the upper electrodes, the lower electrode(s), and/or the piezoelectric layer. For instance, the resonator structures described above can be implemented by patterning the input electrodes and output electrodes of a respective conductive layer symmetrically, as illustrated in FIGS. 1-4. In the examples of FIGS. 1-4, an AC electric field applied across the upper and lower electrodes induces mechanical deformations in one or more planes of the piezoelectric layer via the d31 or d33 coefficient of the piezoelectric material, such as AlN. At the device resonant frequency, the electrical signal across the device is reinforced and the device behaves as an electronic resonant circuit.

In the present implementations, the resonant frequency of a CMR can be directly controlled by setting the finger width, as shown in FIG. 5. One benefit of such a control parameter is that multi-frequency filters can be fabricated on the same chip. CMR 500 has a resonant frequency associated with the finger width, which is based on the spacing in combination with the electrode width of electrodes 104a and 104b, that is, along the X axis. The finger width in a conductive layer of the CMR structure can be altered to adjust the resonant frequency. The resonant frequency is generally lowered as the finger width increases.

The total width, length, and thickness of the resonator structure are parameters that can also be selected. In some CMR implementations, the finger width of the resonator is the main parameter that is controlled to adjust the resonant frequency of the structure, while the total width multiplied by the total length of the resonator (total area) can be set to control the impedance of the resonator structure. In one example, in FIG. 5, the lateral dimensions, i.e., the width and length of resonator structure 500 can be on the order of several 100 microns by several 100 microns for a device designed to operate around 1 GHz. In another example, the lateral dimensions are several 1000 microns by several 1000 microns for a device designed to operate at around 10 MHz. A suitable thickness of the piezoelectric layer can be about 0.01 to 10 microns thick.

The pass band frequency can be determined by the layout of the resonator structure, as can be the terminal impedance. For instance, by changing the shape, size and number of electrodes, the terminal impedance can be adjusted. In some examples, longer fingers along the Y axis of FIGS. 1, 4, and 5 yield smaller impedance. This, in turn, is inversely proportional to the capacitance of the CMR. The resonant frequencies of the CMR structures described herein are generally insensitive to the fabrication process, to the extent that the piezoelectric thickness and thicknesses of the conductive layers do not significantly impact the frequency. The impedance and the frequency can be controlled independently, since the length and the width/spacing of electrodes are in perpendicular directions.

Figure 6:
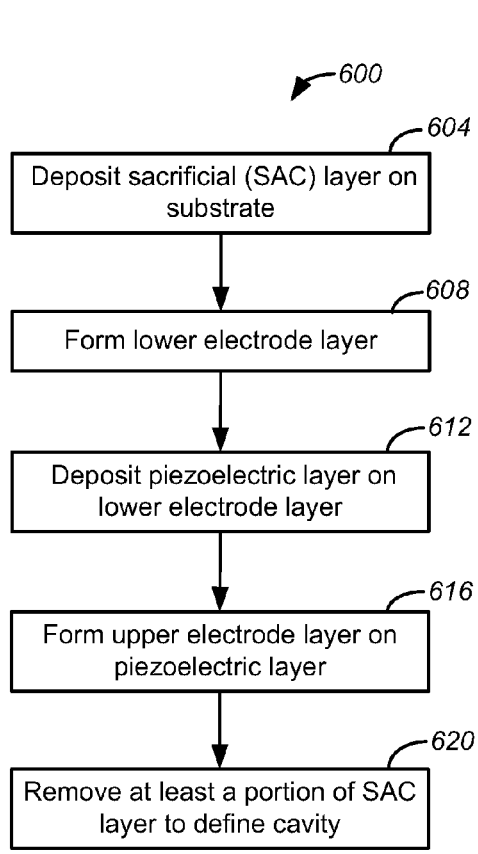
FIG. 6 shows an example of a flow diagram illustrating a process for forming a resonator structure, performed in accordance with one implementation.

FIG. 6 shows an example of a flow diagram illustrating a process for forming a resonator structure, performed in accordance with one implementation. In FIG. 6, process 600 begins in block 604 in which a sacrificial (SAC) layer is deposited on a substrate. The SAC layer can have various shapes and sizes, and can be shaped to cover all or some portion of the substrate, depending on the desired implementation. In block 608, a lower electrode layer is formed on the SAC layer. The lower electrode layer is made of a conductive material such as metal and can be patterned to define one or more electrodes, depending on the desired configuration. When more than one electrode is defined, the electrodes can be connected at separate ports of the resonator device. In block 612, a piezoelectric layer is deposited on the lower electrode layer. In block 616, an upper electrode layer is then formed on the piezoelectric layer. The upper electrode layer can also be patterned to define more than one electrode. In some implementations, overlaying groups of electrodes can be defined in the upper and lower electrode layers on opposite surfaces of the piezoelectric layer. In block 620, part or all of the SAC layer is removed to define a cavity beneath the resonator structure.

Figure 7:
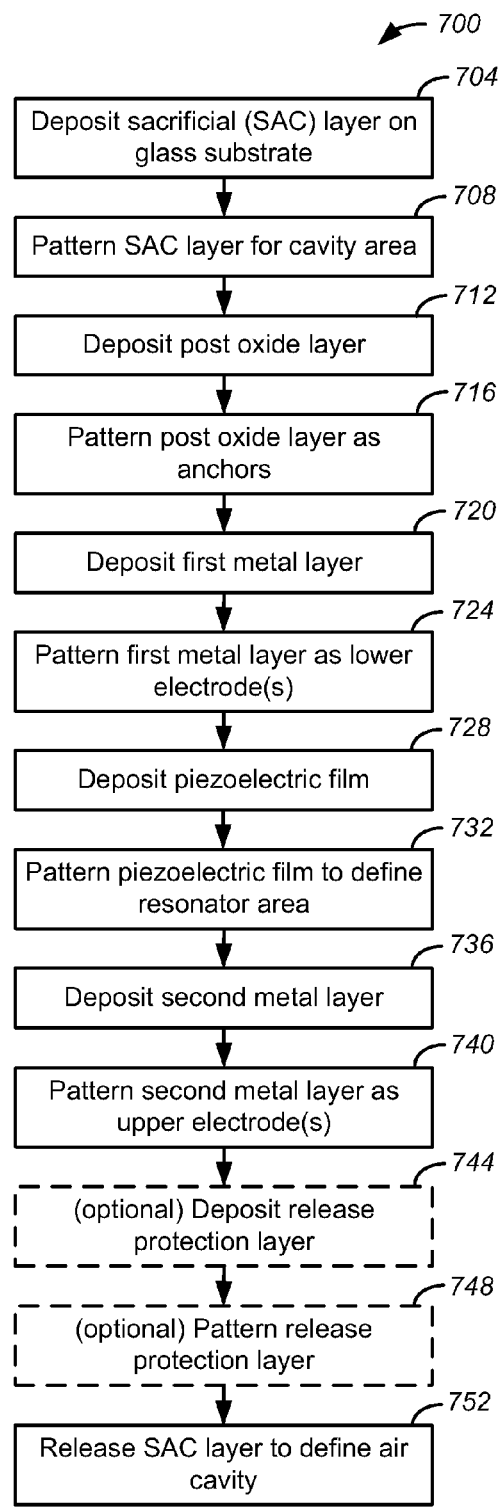
FIG. 7 shows an example of a flow diagram illustrating a process for forming a staggered resonator structure, performed in accordance with one implementation.

FIG. 7 shows an example of a flow diagram illustrating a process for forming a staggered resonator structure, performed in accordance with one implementation. FIGS. 8A-8G show examples of cross-sectional schematic illustrations of stages of staggered resonator fabrication in accordance with a process, for instance, as represented in FIG. 6 or FIG. 7. FIGS. 9A-9G show examples of perspective views of stages of staggered resonator fabrication in accordance with a process, for instance, as represented in FIG. 6 or FIG. 7.

Figure 8A:
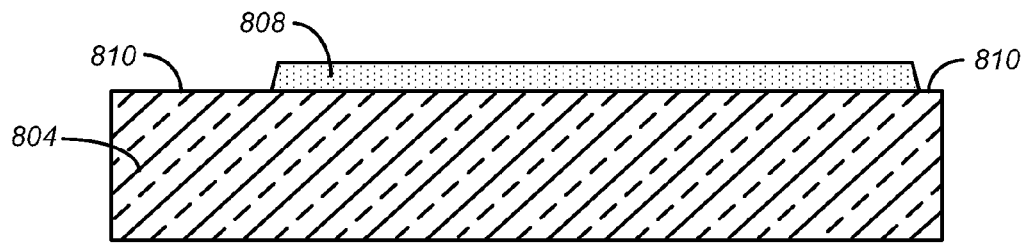
FIGS. 8A-8G show examples of cross-sectional schematic illustrations of stages of staggered resonator fabrication in accordance with a process, for instance, as represented in FIG. 6 or FIG. 7.
Figure 8B:
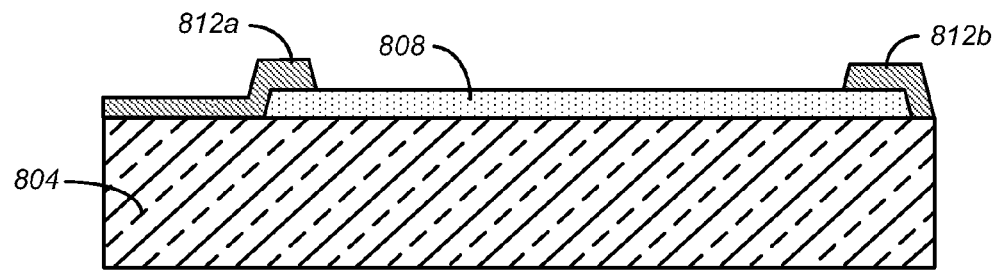
Figure 8C:
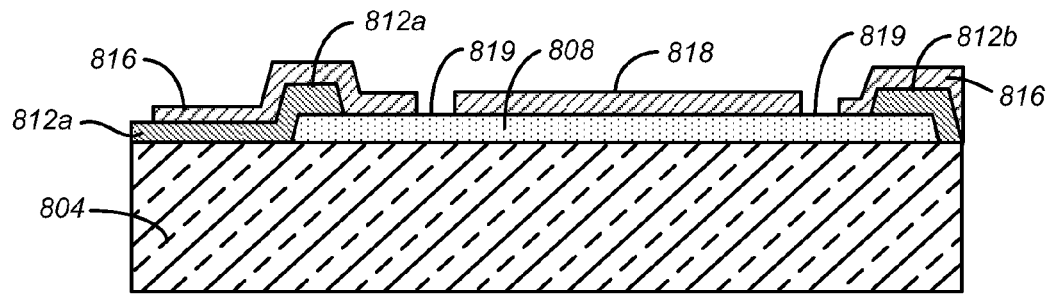
Figure 8D:
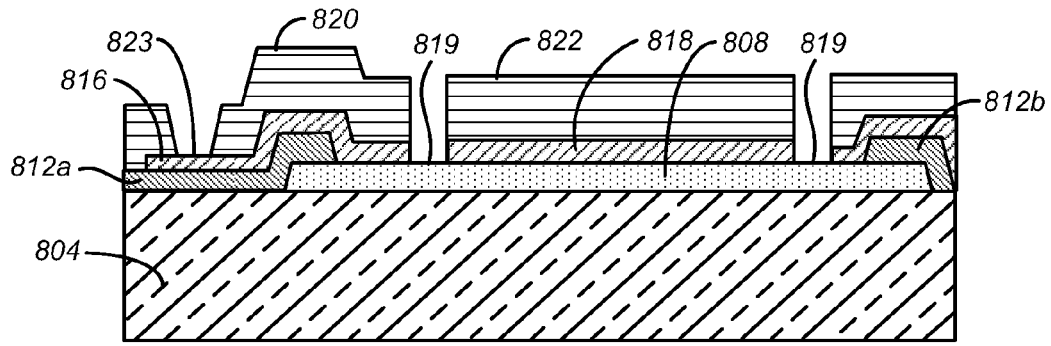
Figure 8E:
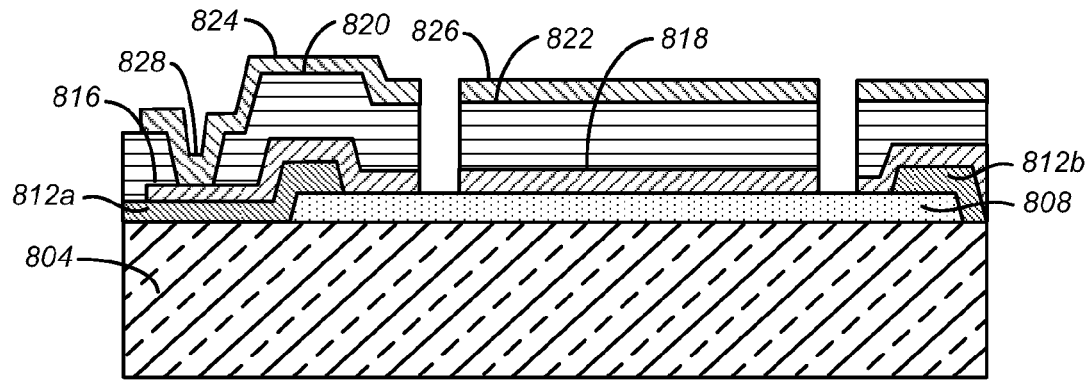
Figure 8F:
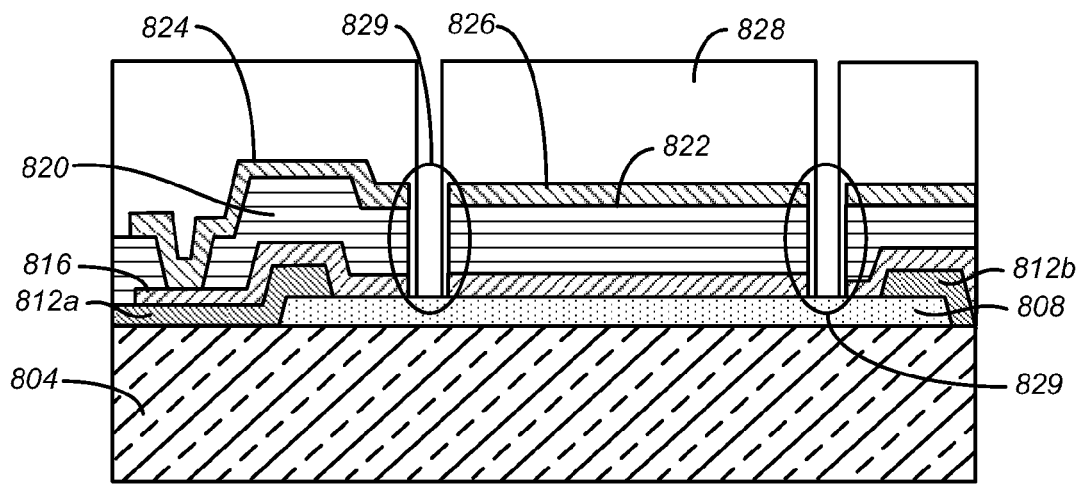
Figure 8G:
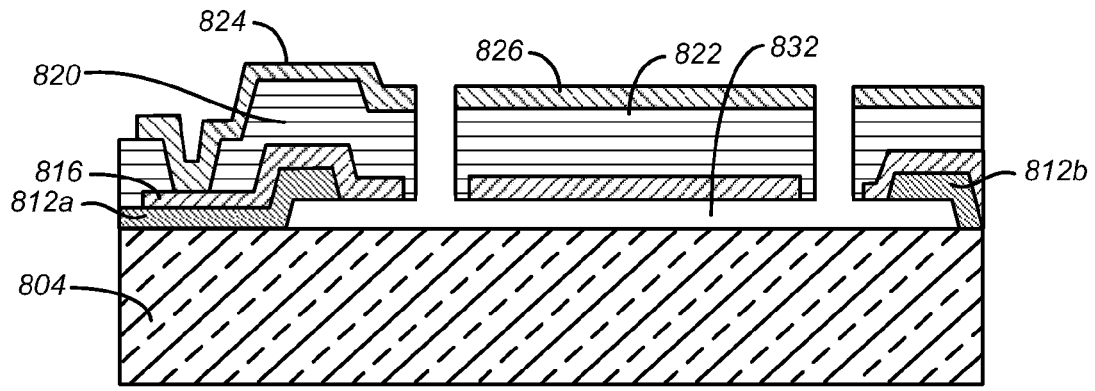
Figure 9A:
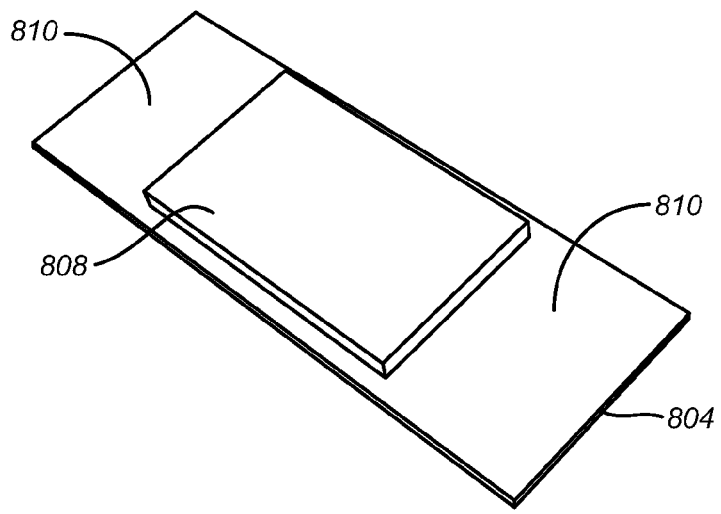
FIGS. 9A-9G show examples of perspective views of stages of staggered resonator fabrication in accordance with a process, for instance, as represented in FIG. 6 or FIG. 7.

In FIG. 7, the process 700 begins in block 704 in which a SAC layer 808 is deposited on a glass substrate 804, as shown in FIGS. 8A and 9A. To form the staggered structure of FIGS. 8 and 9, in block 708, SAC layer 808 is patterned using an appropriately shaped and aligned mask such that SAC layer 808 overlays a portion of substrate 804 and exposes end portions 810 of the surface of substrate 804 on respective ends of SAC layer 808. The SAC layer 808 defines a region in which a cavity will be formed to substantially isolate the resonator structure from the substrate, as further described below. The SAC layer 808 can be formed of silicon oxynitride (SiON), silicon oxide (SiOx), molybdenum (Mo), germanium (Ge), amorphous silicon (a-Si), poly-crystalline silicon, and/or various polymers, for example. In some implementations of process 700, the use of Mo, a-Si, or Ge is advantageous, and a suitable thickness of SAC layer 808 is in the range of about 0.5 micrometers (um) to 3 um. In one example, SAC layer 808 is formed of Mo and has a thickness of about 0.5 um.

Figure 9B:
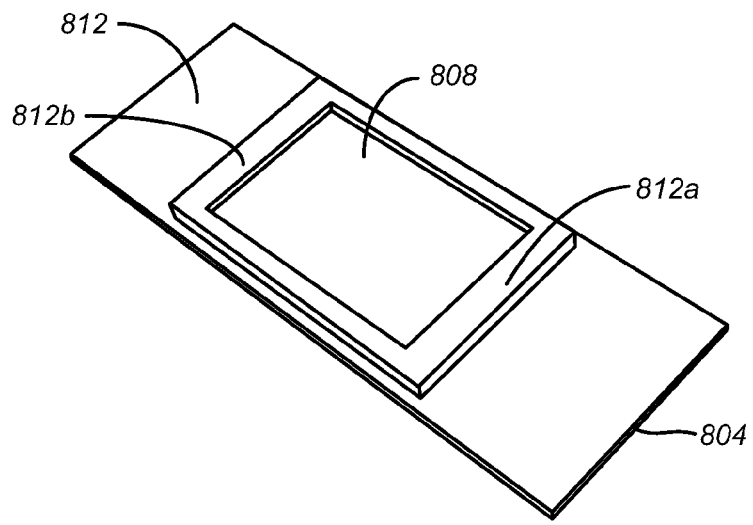

In block 712, a post oxide layer 812 is deposited over SAC layer 808 and exposed surface portions 810 of glass substrate 804. In block 716, to form the staggered structure of FIGS. 8 and 9, the post oxide layer 812 is patterned using an appropriate mask to expose a top portion of the sacrificial layer 808, as shown in FIGS. 8B and 9B. The remaining portions 812a and 812b of the post oxide layer define anchor structures on sides of the structure, as shown in FIGS. 8B and 9B, covering surface portions 810 of substrate 804. The post oxide layer 812 can be formed of materials such as SiOx and SiON and have a thickness, for example, on the order of about 1 um to 3 um. In other implementations, post oxide layer 812 can be formed of NiSi or MoSi$_2$. In some examples, post oxide layer 812 is about 0.5 um, or can be thicker, in the range of about 3 um to 5 um.

Figure 9C:
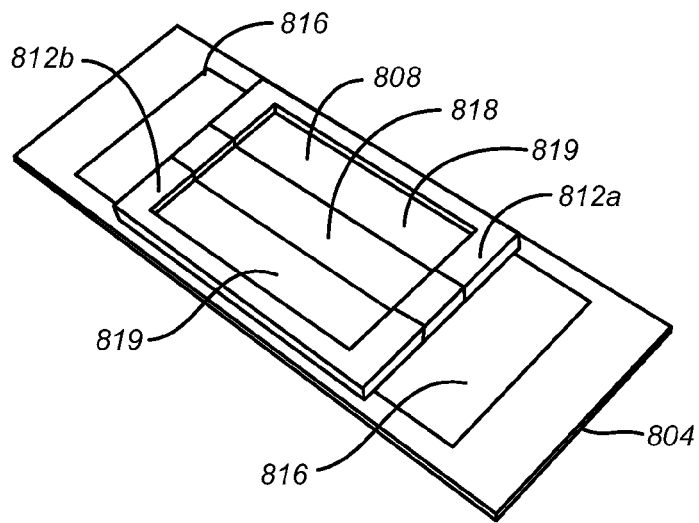
Figure 9D:
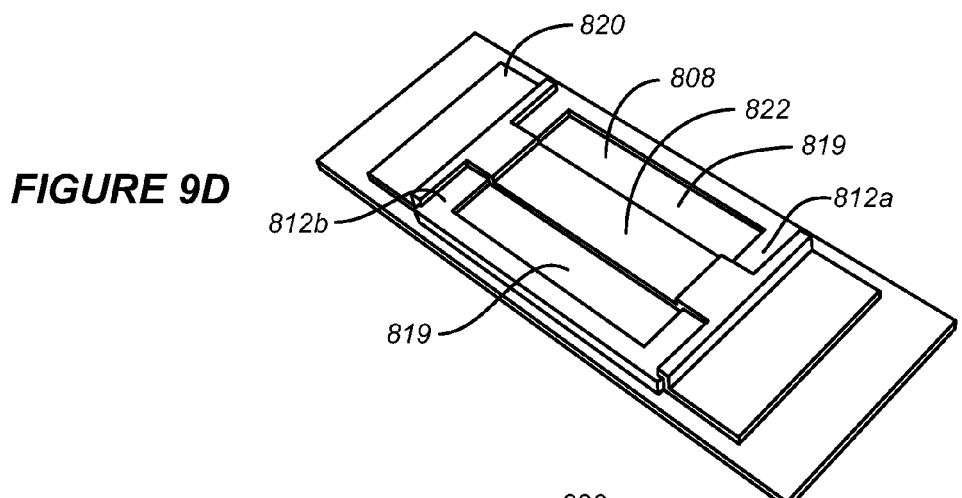

In block 720, a first metal layer 816 is deposited such that it overlays the post oxide anchors 812a and 812b as well as the exposed region of SAC layer 808. Metal layer 816 can be formed of Al, Al/TiN/Al, AlCu, Mo, or other appropriate materials, and have a thickness of 750 to 3000 Angstroms depending on the desired implementation. In some cases, metal layer 816 is deposited as a bi-layer with a metal such as Mo deposited on top of a seed layer such as AlN. An appropriate thickness for the seed layer can be, for example, 100 to 1000 Angstroms. When Mo is used, the thickness can be about 3000 Angstroms. Other suitable materials for metal layer 816 include AlSi, AlCu, Ti, TiN, Al, Pt, Ni, W, Ru, and combinations thereof. Thicknesses can range from about 0.1 um to 0.3 um, depending on the desired implementation. As shown in FIGS. 8C and 9C, in block 724, the first metal layer 816 is patterned using, for instance, an appropriate mask to define one or more lower electrodes 818. In some implementations, the one or more electrodes can be shaped to match overlaying upper electrodes. In the example of FIGS. 8C and 9C, metal layer 816 is formed to have a single electrode 818 in the shape of a strip, which extends laterally across SAC layer 808 and exposes SAC layer 808 on sides 819 of the strip, as shown in FIG. 9C. The exposed areas 819 of SAC layer 808 in FIG. 9C are shown as vias in the cross section depicted by FIGS. 8C-8G, for purposes of illustration.

In block 728, a piezoelectric layer, e.g., film 820, is deposited on the structure. In block 732, the piezoelectric film 820 is patterned using an appropriate mask such that strip 822 of piezoelectric film 820 directly overlays lower electrode portion 818, shown in FIGS. 8D and 9D. Again, as with the deposition and formation of lower electrode layer 818, side areas 819 of SAC layer 808 remain exposed from above. The piezoelectric layer can be formed of AlN and have a thickness, for example, between about 1 um and 2 um. In one example, an AlN piezoelectric film has a thickness of about 1.2 um. Piezoelectric film 820 is patterned at one end of the structure to have one or more vias 823, exposing a portion of first metal layer 816 for conductive contact to be made to first metal layer 816, as shown in FIG. 8D.

Figure 9E:
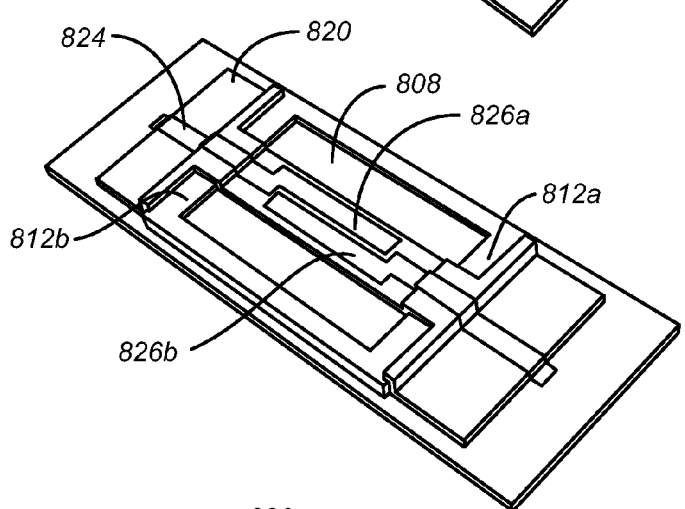

In FIG. 7, a second metal layer 824 is deposited and patterned, in blocks 736 and 740, to define upper electrodes 826, as shown in FIGS. 8E and 9E. The second metal layer 824 can be formed of AlCu, for example, as well as other materials as described above for forming first metal layer 816. In one example, second metal layer 824 is formed of AlCu, and has a thickness of about 2000 Angstroms. Other suitable thicknesses range from about 0.1 um to 0.3 um. As illustrated in FIG. 9E, when second metal layer 824 is patterned, in some implementations, a pair of adjacent electrodes 826a and 826b is formed. In one implementation, electrodes 826a and 826b have longitudinal axes extending along the structure from opposite ends, as shown in FIG. 9E. Thus, the respective electrodes 826a and 826b can be connected to different ports, depending on the desired configuration of input and output signals using the resonator structure. In some implementations, a contact region 828 of second metal layer 824 can be deposited in via 823 so the first and second metal layers are in conductive contact with one another.

Following the formation of the second metal layer 824, a release protection layer 828 such as AlOx can be deposited in block 744 using atomic layer deposition (ALD), physical vapor deposition (PVD), or other appropriate techniques and patterned in block 748 to protect sidewalls 829 of the electrodes in the first and second metal layers 816 and 824 and the sandwiched piezoelectric layer 820, as shown in FIG. 8F. Blocks 744 and 748 of FIG. 7 can be omitted in some implementations. In one implementation, the release protection layer 828 is patterned in block 748 to overlay second metal layer 824, as shown in FIG. 8F. Side areas 819 remain exposed. Release protection layer 828 can be formed of SiON, and have a thickness of about 5000 Angstroms. Release protection layer 828 is then removed after release of SAC layer 808.

Figure 9F:
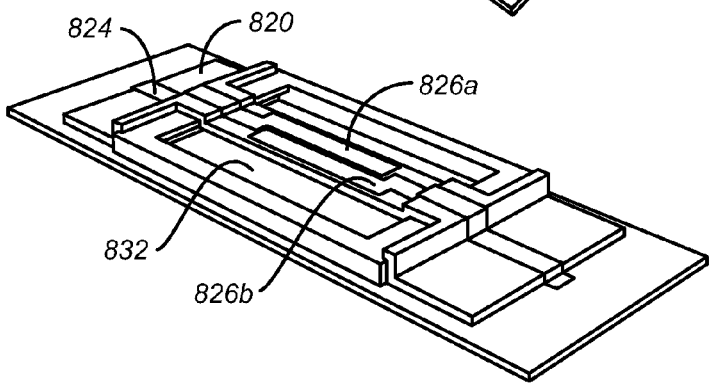
Figure 9G:
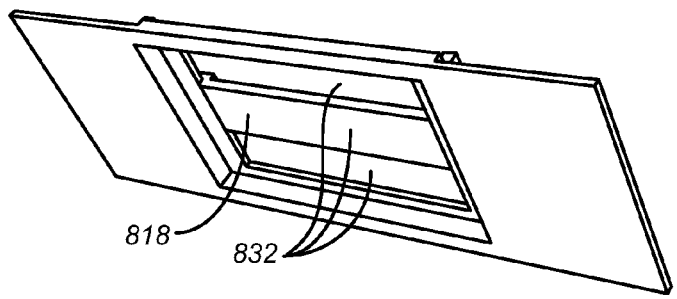

In block 752, SAC layer 808 is then removed to define an air cavity 832, as shown in FIGS. 8G and 9F. In one implementation, SAC layer 808 is released by exposing the structure to XeF$_2$ gas or SF$_6$ plasma, for instance, when the SAC layer 808 is formed of Mo or a-Si. HF can be used when SAC layer 808 is formed of SiON or SiOx. FIG. 9G shows a perspective back view of the resulting resonator structure, with substrate 804 not shown to better illustrate cavity 832. The cavity 832 region is essentially defined by the absence of SAC layer 808; thus, cavity 832 includes side areas 819 and a portion underlying the first metal strip 818 of the resonator.

Following block 752, a metal interconnect layer can be deposited and patterned outside of the resonator structure to define transmission lines to the first and second metal layers 816 and 824. AlSi, AlCu, plated Cu, or other appropriate material can be used to form the metal interconnect layer.

Figure 10:
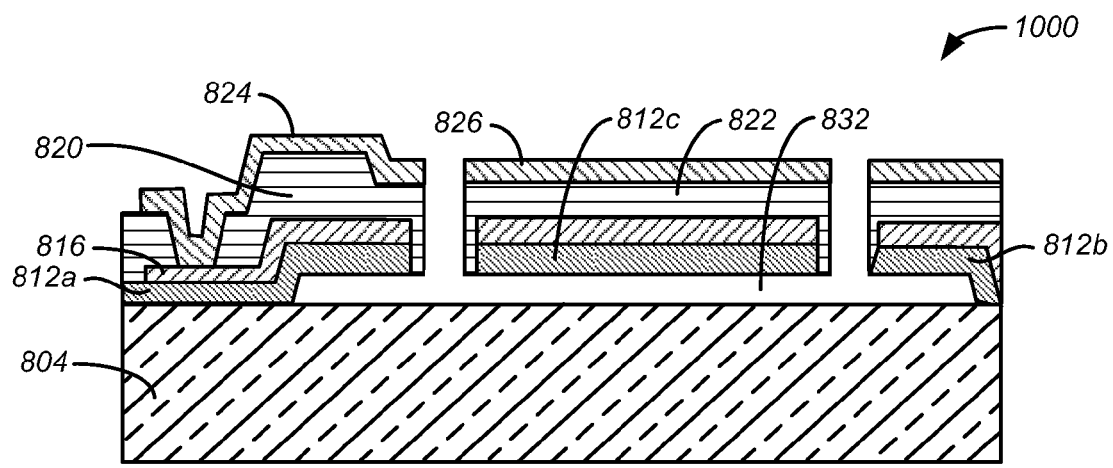
FIG. 10 shows an example of a cross-sectional schematic illustration of a temperature-compensated resonator structure in accordance with one implementation.

FIG. 10 shows an example of a cross-sectional schematic illustration of a temperature-compensated resonator structure in accordance with one implementation. The temperature compensated structure 1000 of FIG. 10 can be fabricated using the same processes as described above with respect to FIGS. 7-9, with a slight variation. Here, the post oxide layer 812 is patterned in block 716 such that a strip of the post oxide layer 812c remains and underlies the lower electrode(s) 818. In one implementation, the post oxide strip 812c is aligned with the overlaying lower electrode 818, piezoelectric layer 822, and upper electrodes 826 of the resonator structure. This strip 812c defines a temperature compensation layer for the resonator structure. The thickness of post oxide layer as a temperature compensation layer is often dependent on the choice of materials for the piezoelectric and electrode layers. In one case where the piezoelectric material is AlN, the electrodes are AlCu, Mo or a combination of both, and the post oxide layer is SiO2, the thickness for the SiO2 layer is of comparable magnitude to the thickness of the AlN layer.

In FIG. 10, the temperature compensation layer 812c provides resonators with a lower magnitude temperature-coefficient of frequency (TCF). This can be achieved by the selection of an appropriate material and layer thicknesses, as described above, for post oxide layer 812, which serves as the thin-film compensation layer.

Figure 11:
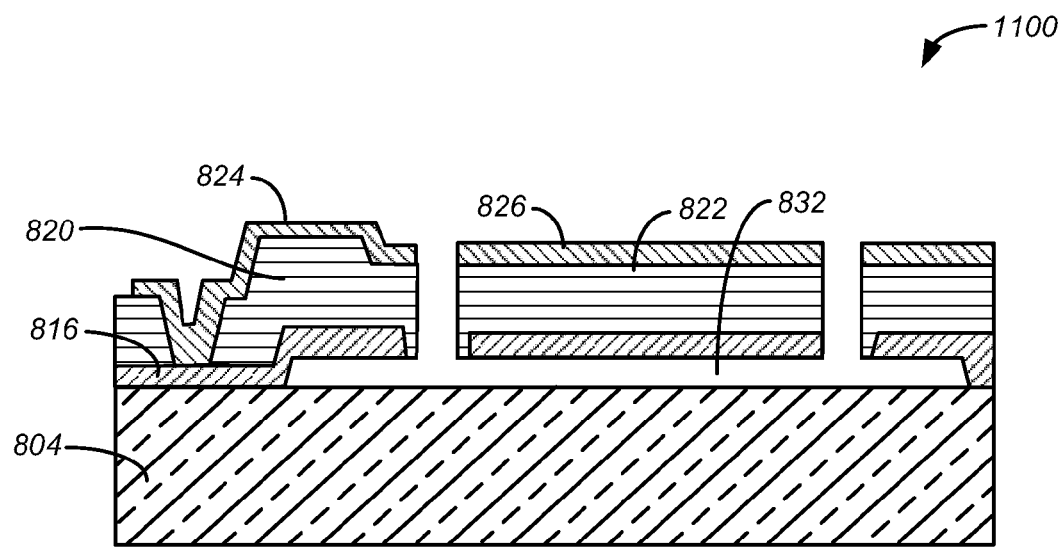
FIG. 11 shows an example of a cross-sectional schematic illustration of an airgap resonator structure in accordance with one implementation.

FIG. 11 shows an example of a cross-sectional schematic illustration of an airgap resonator structure in accordance with one implementation. The airgap structure 1100 of FIG. 11 can also be fabricated using essentially the same processes as described above with respect to FIGS. 7-9. Here, blocks 712 and 716 have been omitted, so that no post oxide layer is formed. The lower electrode layer is thus deposited and patterned in blocks 720 and 724 so that it directly overlays SAC layer 808 and the exposed areas 810 of substrate 804. The remaining fabrication blocks can be performed as described above with respect to FIGS. 7-9.

The piezoelectric materials that can be used in fabrication of the piezoelectric layers of electromechanical systems resonators disclosed herein include, for example, aluminum nitride, zinc oxide, gallium arsenide, aluminum gallium arsenide, gallium nitride, quartz and other piezoelectric materials such as zinc-sulfide, cadmium-sulfide, lithium tantalate, lithium niobate, lead zirconate titanate, members of the lead lanthanum zirconate titanate family, doped aluminum nitride (AlN: Sc), and combinations thereof. The conductive layers of upper and lower electrodes may be made of various conductive materials including platinum, aluminum, molybdenum, tungsten, titanium, niobium, ruthenium, chromium, doped polycrystalline silicon, doped AlGaAs compounds, gold, copper, silver, tantalum, cobalt, nickel, palladium, silicon germanium, doped conductive zinc oxide, and combinations thereof. In various implementations, the upper metal electrodes and/or the lower metal electrodes can include the same conductive material(s) or different conductive materials.

Returning to the examples of FIGS. 1-3, differential to differential signaling, single ended to differential signaling, or differential to single ended signaling can be provided using the same CMR structure, depending on the desired configuration. For instance, a differential input signal can be provided to Ports 1A and 2A. Responsive to the differential input signal, a differential output signal can be sensed at Ports 1B and 2B.

Figure 12A:
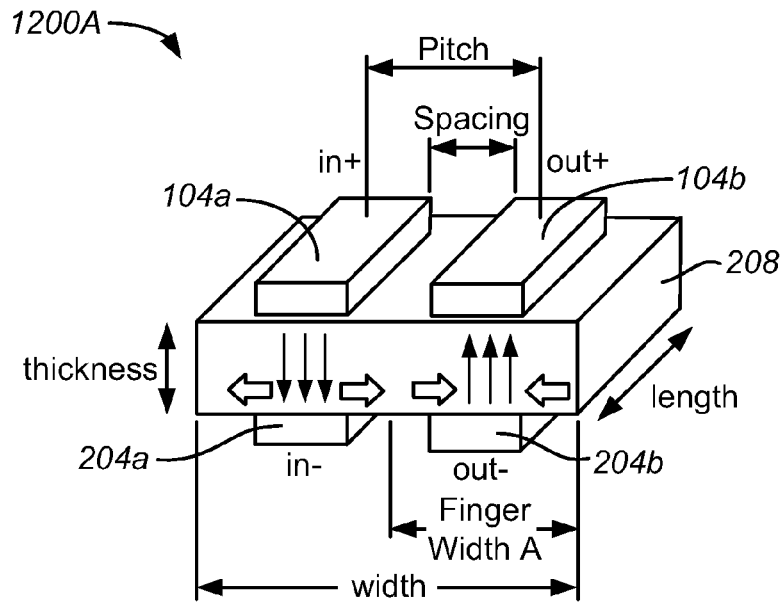
FIGS. 12A and 12B show examples of perspective views of CMR structures in accordance with one or more fully differential signaling implementations.
Figure 12B:
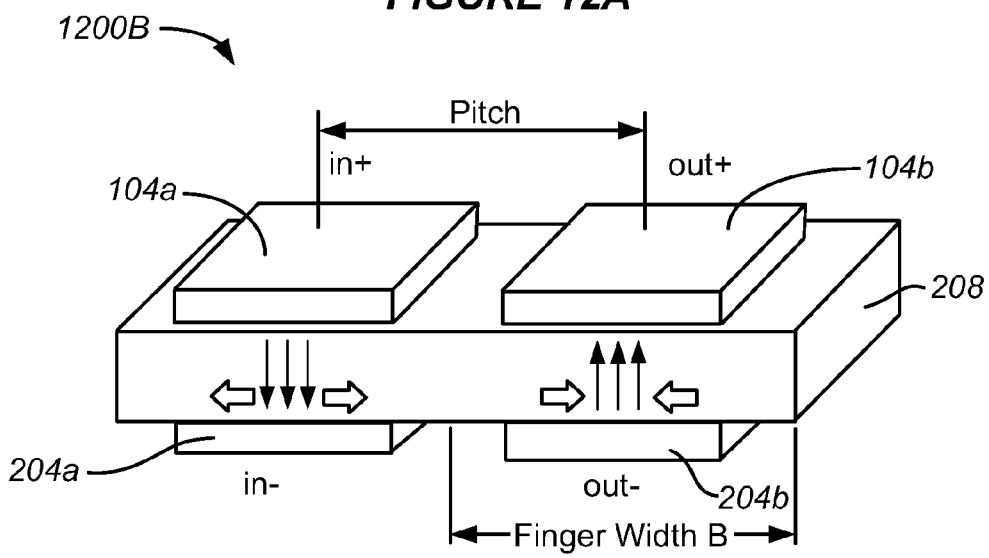

FIGS. 12A and 12B show examples of perspective views of CMR structures in accordance with one or more fully differential signaling implementations. In FIGS. 12A and 12B, The CMRs 1200A and 1200B generally include an upper conductive layer and a lower conductive layer, as described above, with a piezoelectric layer disposed between the two conductive layers. In FIGS. 12A and 12B, the lower conductive layer includes one or more input electrodes 204a at which a first input signal, in−, is provided and one or more output electrodes 204b at which a first output signal, out−, is provided. The upper conductive layer includes one or more input electrodes 104a at which a second input signal in+ is provided. The input electrodes 104a are facing and spaced apart from the corresponding input electrode(s) 204a of the lower conductive layer by virtue of the piezoelectric layer 208. Similarly, one or more output out+ electrodes 104b are facing and spaced apart from corresponding output electrode(s) 204b of the lower conductive layer.

The input ports/electrodes of the various resonator structures and devices disclosed herein can be connected to the outputs of components which deliver signals to the resonator structure, such as an amplifier or an antenna output. In this way, when such input signals are provided to the input electrodes of the CMR, such as electrodes 104a and 204a of FIGS. 12A and 12B, an alternating electric field can be applied across the thickness of the piezoelectric layer 208, as illustrated in FIGS. 12A and 12B.

In the present implementations, the resonant frequency of a CMR can be directly controlled by setting the finger width, as shown in FIGS. 12A and 12B. One benefit of such a construction is that multi-frequency filters can be fabricated on the same chip. CMR 1200A of FIG. 12A has a resonant frequency associated with a finger width, "finger width A," along the width of the device. CMR 1200B has a different resonant frequency from CMR 1200A, that is, associated with the finger width of its electrodes, "finger width B."

FIGS. 12A and 12B illustrate a four-port structure with pairs of planar elongated electrodes on opposite sides of the piezoelectric layer, where the electrodes have longitudinal axes oriented along a length of the device, substantially parallel with one another. The differential input electrodes are marked in+ and in−, and the differential output electrodes are marked out+ and out−. When a differential input signal is applied to electrodes in+ and in−, a vertical electric field is induced across the piezoelectric layer 208 thickness, causing extensional mechanical stress in the plane of the piezoelectric layer (through the d31 piezoelectric coefficient) along the width of the structure, that is, exciting the structure in a contour mode of displacement. This mechanical energy is converted back to a differential electrical signal at the output electrodes out+ and out−.

Figure 13:
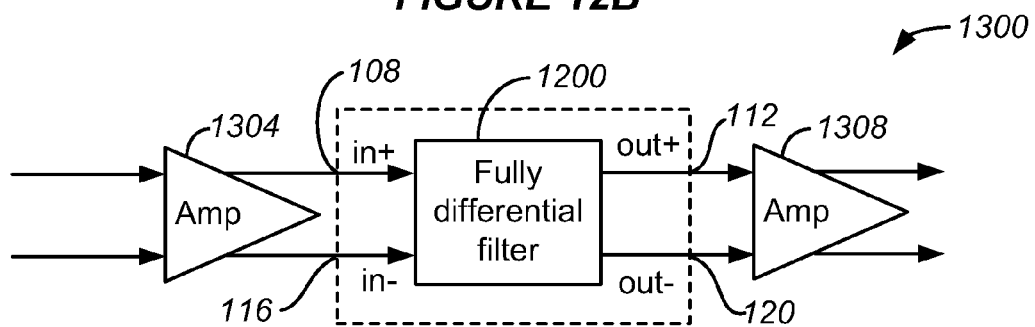
FIG. 13 shows an example of a system block diagram of a circuit incorporating a CMR as a fully differential filter.

FIG. 13 shows an example of a system block diagram of a circuit incorporating a CMR as a fully differential filter. FIG. 13 shows a fully differential system 1300 incorporating one or more of CMRs 1200A and 1200B. In the circuit diagram of FIG. 13, the CMR 1200 is implemented as a fully differential filter with input ports 108 and 116 (in+ and in−), as described above, connected to differential output terminals of a circuit component such as an amplifier 1304. Similarly, differential output ports 112 and 120 are coupled to input terminals of another circuit component such as amplifier 1308.

In some implementations of differential filters incorporating a CMR, as illustrated in FIGS. 12 and 13 by way of example, the effective input electrical signal is the potential difference between the differential input signal (in+) delivered to upper electrode(s) 104a and the differential input signal (in−) delivered to lower electrode(s) 204a. Thus, when a common mode signal, i.e., with the same phase between the in+ and in− signals, is provided as an input, there is no potential difference and hence no electric field in the piezoelectric layer 208. Thus, a common mode signal is effectively blocked by this CMR implementation, as it will not translate to a mechanical signal in the piezoelectric layer. In the examples of FIGS. 12 and 13, a differential signal will generate an electric field to result in mechanical energy. The effective output signal, resulting from movement of the piezoelectric layer, is the potential difference between the signals provided to the electrode(s) 104*b* (out+) and electrode(s) 204*b* (out−). The configuration of FIGS. 12 and 13 suppresses common mode to differential mode conversions and vice versa.

Figure 14:
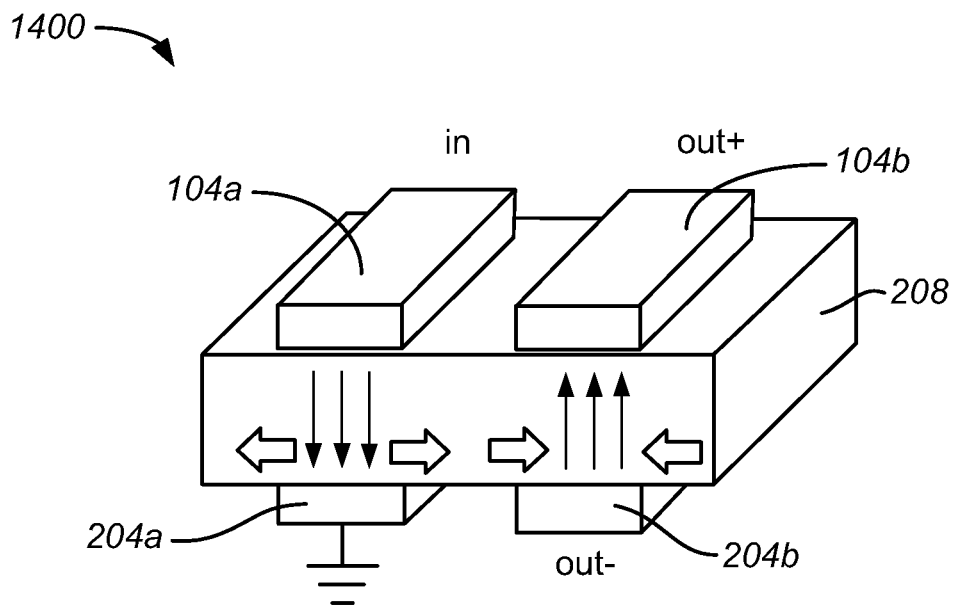
FIG. 14 shows an example of a perspective view of a CMR structure in accordance with one or more single ended to differential signaling implementations.

The same CMR structures as described above can be implemented as a single ended to differential filter. For instance, FIG. 14 shows an example of a perspective view of a CMR structure in accordance with one or more single ended to differential signaling implementations. In FIG. 14, CMR 1400 has a similar structure and geometry as CMRs 1200 of FIGS. 12A and 12B. However, one difference between the structures is that the in− electrode(s) 204*a* of the CMR has been connected to ground. Thus, a single ended input signal delivered to the remaining input electrode(s) 104*a* at the appropriate frequency can be converted to a differential signal at output electrode(s) 104*b* (out+) and 204*b* (out−). Returning to FIG. 1, in this single ended to differential configuration, input electrodes 204*a* or 104*a* can be connected to ground 124 and/or ground 128 via tethers as described above. Separate sets of tethers can be used to route the input electrical signal and differential output electrical signals.

Figure 15:
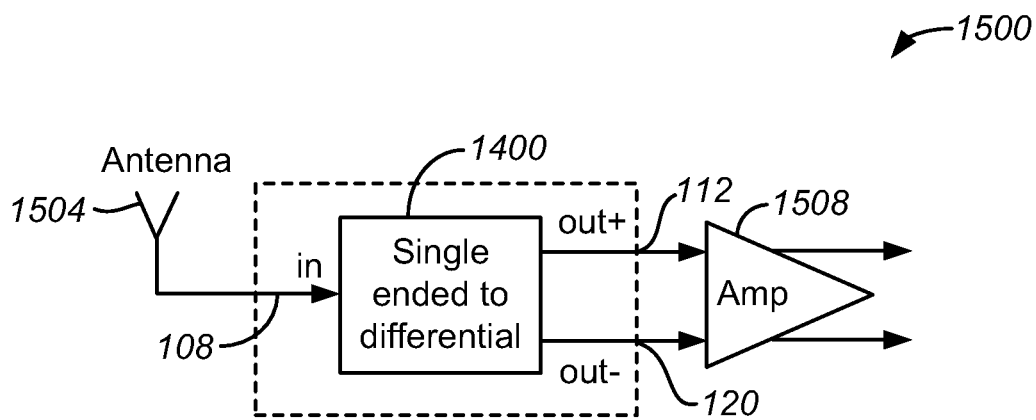
FIG. 15 shows an example of a system block diagram of a circuit incorporating a CMR as a single ended to differential filter.

FIG. 15 shows an example of a system block diagram of a circuit incorporating a CMR as a single ended to differential filter. In FIG. 15, single ended to differential CMR 1400 is integrated as a filter with other components in a single ended to differential system. For instance, the CMR 1400 can be used in a receiver of a wireless transmission system. An antenna 1504 receives a wireless signal and outputs a single ended signal to the input port 108 of CMR 1400 (corresponding to input electrode 104*a* of FIG. 14), while the circuit components of the receiver, such as amplifier 1508, have differential inputs coupled to receive the differential output signals from ports 112 and 120 of the CMR. With one of the differential input ports 108 or 116 connected to ground, depending on the desired implementation, the potential difference between the input electrode(s) and grounded electrodes is the single ended signal, while the output signal at ports 112 and 120 is differential.

Figure 16:
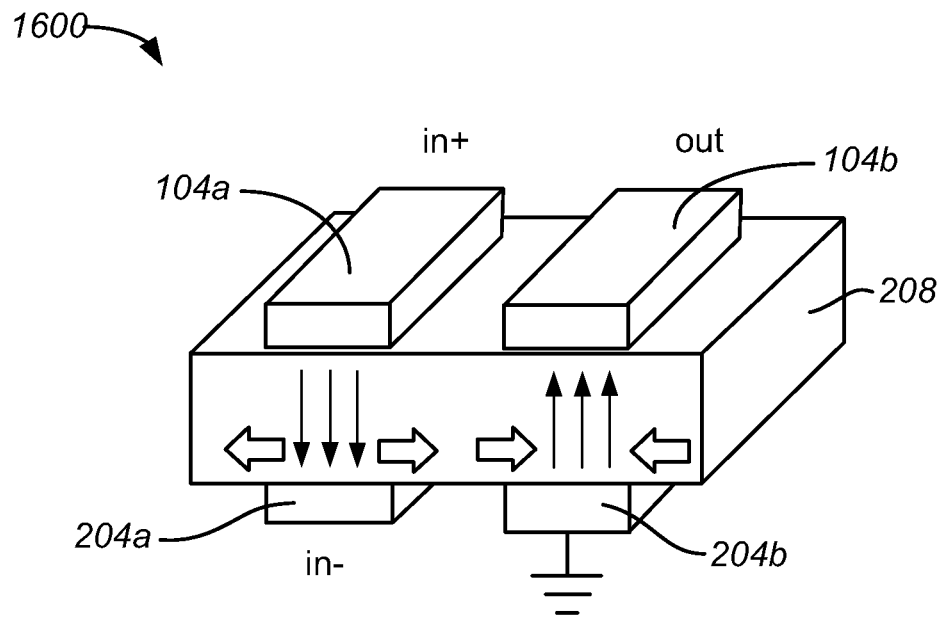
FIG. 16 shows an example of a perspective view of a CMR structure in accordance with one or more differential to single ended signaling implementations.
Figure 17:
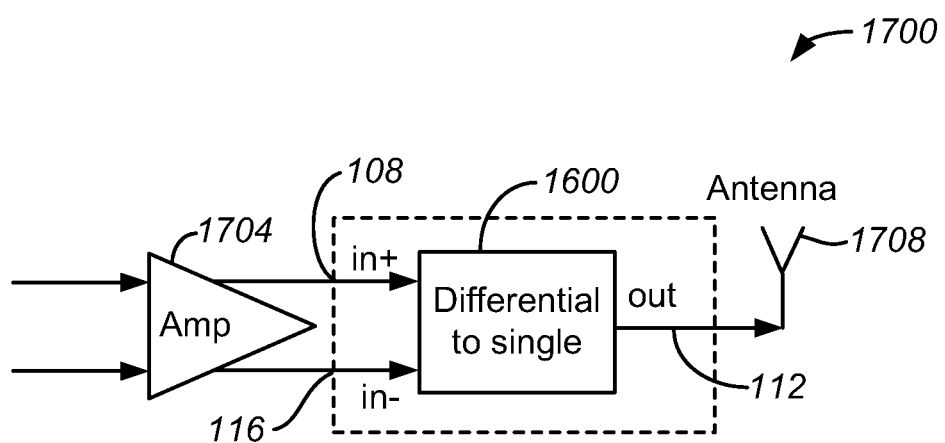
FIG. 17 shows an example of a system block diagram of a circuit incorporating a CMR as a differential to single ended filter.

A differential to single ended system can be constructed, again using the same CMR structures as disclosed herein, by connecting one of the output ports 112 or 120 to ground, while leaving the input ports 108 and 116 as differential inputs. FIG. 16 shows an example of a perspective view of a CMR structure in accordance with one or more differential to single ended signaling implementations, while FIG. 17 shows an example of a system block diagram of a circuit incorporating a CMR as a differential to single ended filter. In FIG. 16, a differential signal delivered to differential input electrodes 104*a* and 204*a* is converted to a single ended output signal at electrode(s) 104*b*. Here, the out− port 120, corresponding to electrode(s) 204*b*, has been connected to ground.

In FIG. 17, single ended to differential CMR 1600 of FIG. 16 is integrated as a filter with other electronic components. For instance, the differential to single ended filter can be incorporated as a transmission device of a wireless system, in which a circuit component such as an amplifier 1704 is configured to output a differential signal to differential input electrodes 104*a* and 204*a* (ports 108 and 116), while the antenna is configured to receive a single ended output signal from electrode 104*b* (port 112) and transmit this electrical signal as a wireless signal. In such implementations, when either of the differential output ports 112 or 120 is connected to ground, the potential difference between the two input ports is the differential input signal, while the potential difference between the remaining output port and ground is the single ended output signal.

Figure 18:
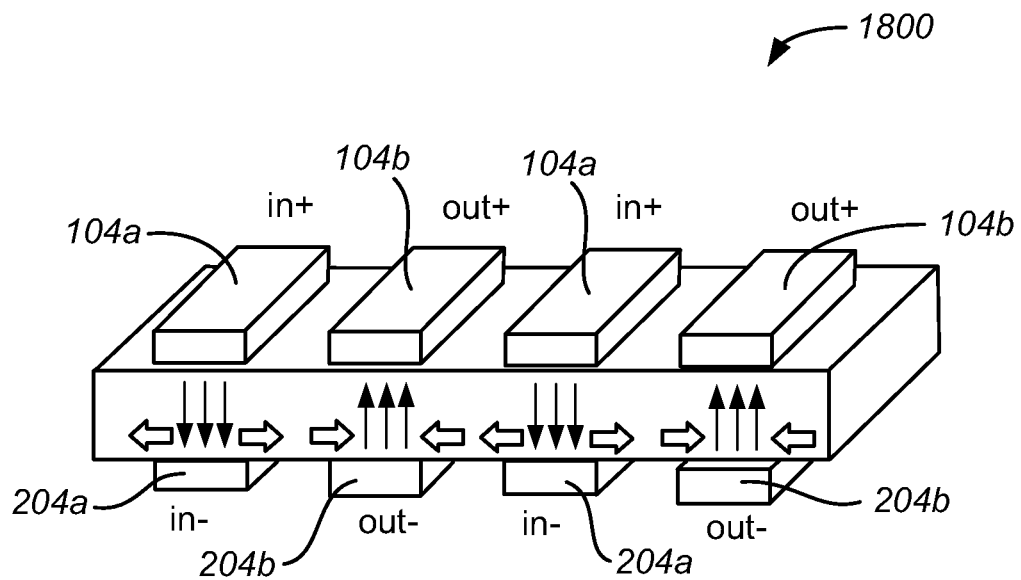
FIG. 18 shows an example of a perspective view of an alternative CMR structure having additional electrodes in accordance with one or more implementations.

Returning to FIGS. 1-3, CMRs constructed in accordance with the implementations herein can include more than one electrode coupled to a particular differential input signal, and the same is true with respect to the differential output signals. FIG. 18 shows an example of a perspective view of an alternative CMR structure having additional electrodes in accordance with one or more implementations. As shown in FIG. 18, two or more input electrodes 104*a* in the upper conductive layer can be coupled to the in+ port 108 of FIG. 1, and two or more input electrodes 204*a* in the lower conductive layer can be coupled to the in− port 116. Similarly, output electrodes 104*b* are coupled to the out+ port 112, while output electrodes 204*b* are coupled to the out− port 120. The electrodes can be shaped as "fingers," as described above. In some applications, multiple fingers are desirable, e.g., 3 fingers, 4 fingers, 5 fingers, 10 fingers, etc. CMRs with such multiple fingers can be desirable to tune the impedance of the CMR device.

Figure 19:
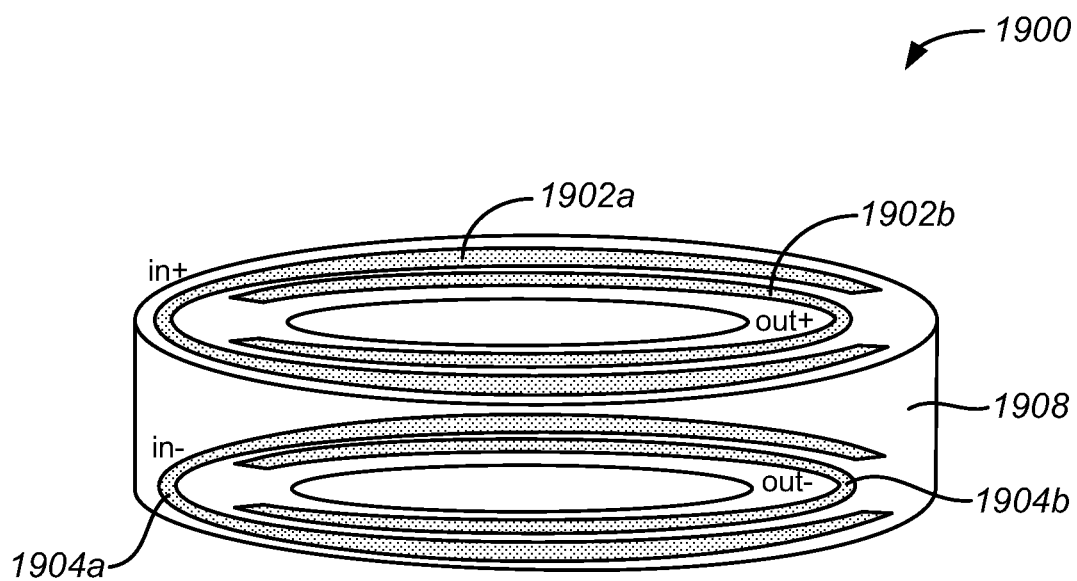
FIG. 19 shows an example of a perspective view of an alternative CMR structure having ring-shaped electrodes in accordance with one or more implementations.

In other implementations, electrodes of the CMR have different geometries than the elongated fingers described above. For instance, electrodes can be rectangular of various dimensions, diamond-shaped, and arc-shaped. FIG. 19 shows an example of a perspective view of an alternative CMR structure having ring-shaped electrodes in accordance with one or more implementations. In one example, input electrodes 1902*a* and 1904*a* of FIG. 19 can be shaped as circular ring plates on opposite sides of a cylindrical piezoelectric layer 1908, and output electrodes 1902*b* and 1904*b* can have similar shapes and situated on an inner side of the input electrodes in a respective conductive layer, as illustrated. Rectangular rings are also contemplated within the present implementations. The electrodes are substantially oriented along one dimension, spaced apart from one another within the same layer, and with opposing pairs of electrodes in the respective layers aligned and facing one another.

By the same token, the piezoelectric layer can have alternate shapes such as a rectangle, a circle, a polygon, a circular annulus, a rectangular annulus, a polygonal annulus, or some combination thereof. In some applications, such as high frequency circuits, these various alternative geometries can provide a higher Q factor. The frequency of vibration can be controlled by varying the width of the structure, whereas the thickness can be varied to control the equivalent motional resistance and static capacitance of the device. One reason for using such alternative geometries could be size constraints, in which a CMR with elongated fingers might not fit properly.

In FIG. 19, contour mode vibrations can be excited in a plane in which the piezoelectric layer 1908 is oriented, corresponding to a length/width of the rectangular devices described above, via the d31 piezoelectric coefficient. By applying an electric field across the layer 1908 sandwiched between top electrodes 1902*a* and 1902*b* and bottom electrodes 1904*a* and 1904*b*, the electromechanical systems structure 1900 tends to expand laterally and can be excited in resonant vibrations, the frequency of which is set by the in-plane dimensions of the device. The ring structures of FIG. 19 facilitate high Q and high frequency of operations.

CMRs constructed in accordance with some of the implementations herein can be configured to provide multiple resonant frequencies. Any number of CMR structures can be connected in parallel, for example, in the implementations described below. Such CMRs can be fabricated on the same silicon substrate. The present implementations of CMRs can be employed in RF wireless communications as frequency reference elements or arranged in arrays to form banks of multi-frequency filters. In some implementations, the disclosed resonators are capable of exhibiting frequencies ranging approximately from 200 to 800 MHz, Q factor of a few thousands (1,000-2,500) and motional resistance ranging from about 25 to 1000 ohms.

FIGS. 20-23 show duplexers constructed with one or more CMRs having structures as described above. While the examples of FIGS. 20-23 incorporate rectangular CMRs, alternative shapes of CMRs such as structure 1900 of FIG. 19 can be used. FIG. 20A shows an example of a perspective view of a duplexer system incorporating two or more CMR structures in accordance with one implementation, while FIG. 20B shows an example of a perspective view of a duplexer system incorporating two or more CMR structures in accordance with another implementation. In FIGS. 20A and 20B, a duplexer is constructed using two separate CMRs, as illustrated. The CMRs can be situated so that their respective sets of electrodes are adjacent to each other in lateral dimensions, for instance, in relation to the widths of the devices as shown. When the two or more resonators are viewed as an integral unit, the total width of the combined structure has been effectively modified. Two or more separate CMR devices can be connected in parallel as an array of CMRs. For example, in FIG. 20A, a first CMR 2000A having electrodes 2004 and 2014 is connected in parallel with a second CMR 2000B having electrodes 2024 and 2034. In some alternative configurations, the separate CMR structures are stacked rather than being adjacent to one another.

Figure 20A:
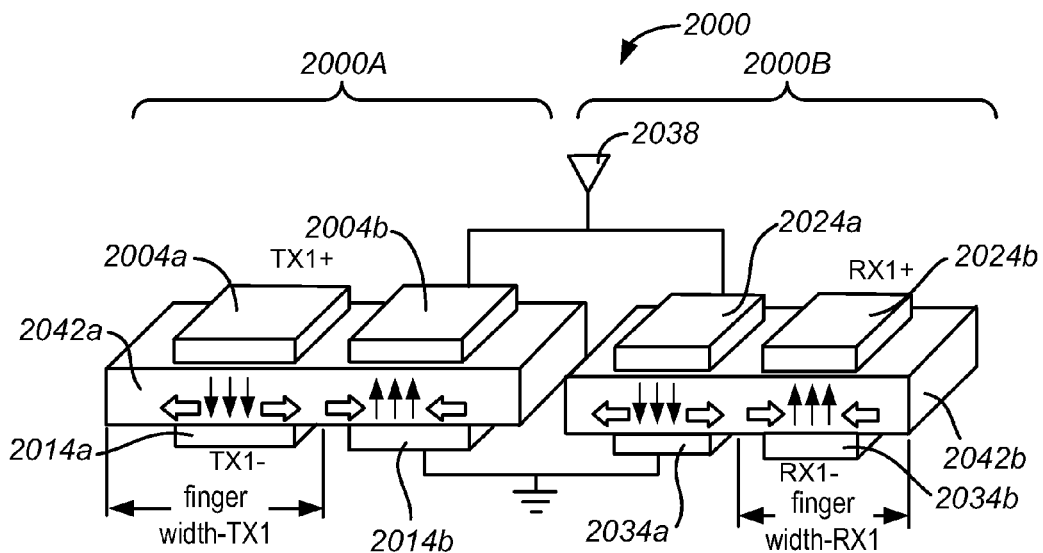
FIG. 20A shows an example of a perspective view of a duplexer system incorporating two or more CMR structures in accordance with one implementation.
Figure 20B:
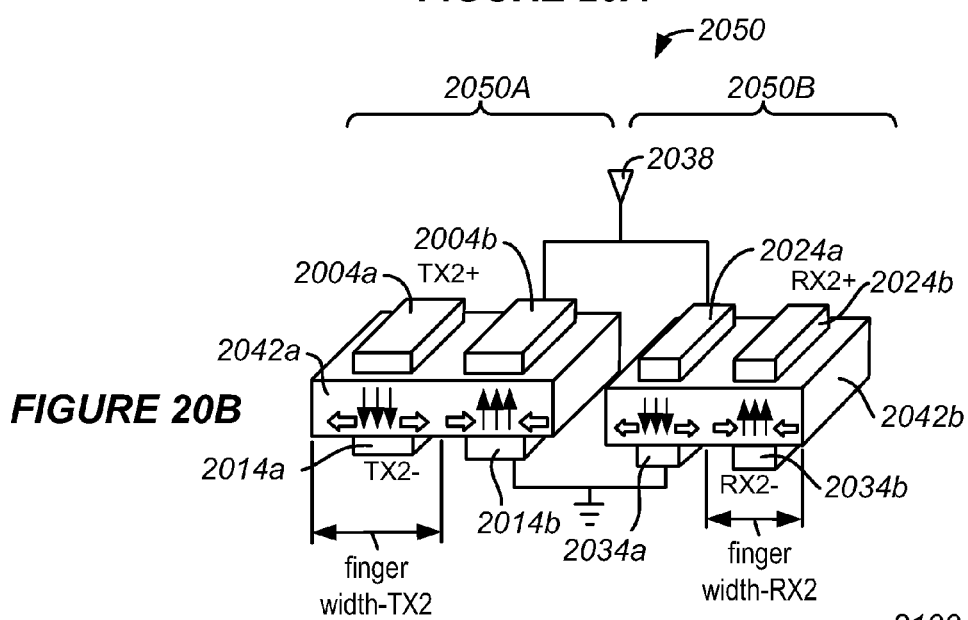
FIG. 20B shows an example of a perspective view of a duplexer system incorporating two or more CMR structures in accordance with another implementation.

In FIGS. 20A and 20B, the duplexer can be viewed as a combination of the single ended to differential CMR structure of FIG. 14 and the differential to single ended CMR structure of FIG. 16. The individual CMR structure geometries can be the same as described above. In FIG. 20A, the transmission CMR 2000A of the duplexer 2000 includes differential input electrodes (TX1+) 2004a and (TX1−) 2014a corresponding to the in+ and in− electrodes of CMR 1600 in FIG. 16. As with CMR 1600, an output electrode 2004b is connected to antenna 2038, while the corresponding electrode 2014b on the other side of the CMR 2000A is coupled to ground. The receiver CMR 2000B of duplexer 2000 includes differential output electrodes (RX1+) 2024b and (RX1−) 2034b corresponding to the out+ and out− electrodes of CMR 1400 in FIG. 14. In the receiver CMR, as with CMR 1400, input electrode 2024a is connected to antenna 2038, while corresponding electrode 2034a shares the same ground with electrode 2014b. In this way, duplexer 2000 is capable of sending differential signals using the transmission CMR 2000A and receiving differential signals using the receiver CMR 2000B using the same antenna 2038. The respective piezoelectric layers 2042a and 2042b can have about the same thicknesses and be made of the same materials when the separate CMRs of FIG. 20A are fabricated on the same die. In an alternative implementation, the transmission CMR and receiver CMR are made on different dies and have piezoelectric layers with different dimensions and materials.

In FIG. 20A, the electrodes in the separate CMR structures 2000A and 2000B can have the same or different finger widths. For example, the "finger width-TX1" associated with electrode 2014a can be the same as or different from the "finger width-RX1" associated with electrode 2034b. By configuring the finger widths, the duplexer 2000 operates at different frequency bands. That is, transmission CMR 2000A is capable of sending signals to antenna 2038 at a first frequency band corresponding to finger width-TX1, while the receiver CMR 2000B is capable of receiving signals from antenna at a second frequency band corresponding to finger width-RX1.

The duplexer 2050 of FIG. 20B shares the same general attributes of duplexer 2000 of FIG. 20A, with a transmission CMR 2050A and a receiver CMR 2050B, although the finger widths of the electrodes "finger width-TX2" and "finger width-RX2" corresponding to respective finger widths finger width-TX1 and finger width-RX1 of duplexer 2000 are smaller, thus providing different transmission and reception frequency bands than the duplexer 2000 of FIG. 20A. In FIGS. 20A and 20B, duplexers of various frequency bands (e.g., 450 MHz, 900 MHz, 1800 MHz, 2400 MHz) can be designed on the same wafer with the same piezoelectric thickness. The desired frequencies can be controlled by setting the corresponding finger widths of the electrodes.

Figure 21:
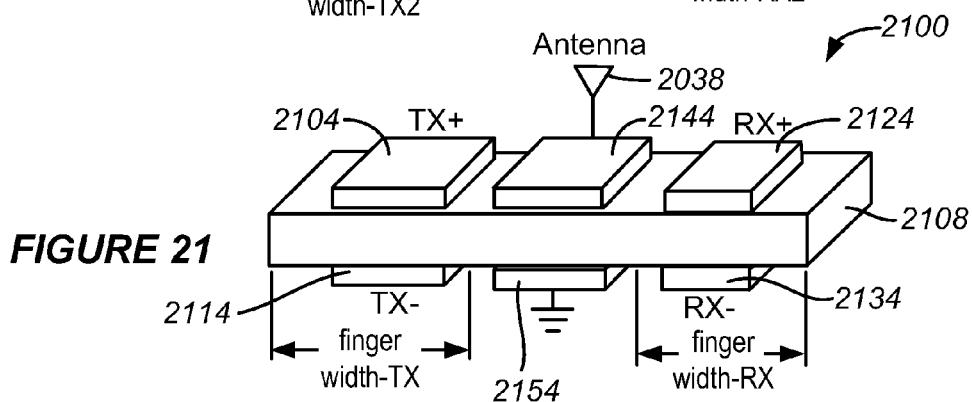
FIG. 21 shows an example of a perspective view of a duplexer system incorporating a CMR structure in accordance with one implementation.

FIG. 21 shows an example of a perspective view of a duplexer system incorporating a CMR structure in accordance with one implementation. FIG. 21 shows an alternative duplexer implementation with a single CMR 2100, thus having a more compact design. In FIG. 21, a single CMR structure is fabricated to have an opposing pair of differential input electrodes 2104 (TX+) and 2114 (TX−) and a pair of differential output electrodes 2124 (RX+) and 2134 (RX−). On one side of the CMR 2100, a separate electrode 2144 is connected to antenna 2038, while a corresponding electrode 2154 on the opposite side of CMR 2100 is coupled to ground. In this implementation, electrode 2144 represents a merger of electrodes 2004b and 2024a of FIGS. 20A and 20B, while ground electrode 2154 represents a merger of electrodes 2014b and 2034a. In this way, CMR 2100 can be viewed as a merger of separate transmission and receiver CMRs into a single integral device. Returning to FIG. 1, with CMR 2100, each electrode would be connected to a separate port on the CMR structure. For example, port 128 could be coupled to antenna 2038.

Figure 22:
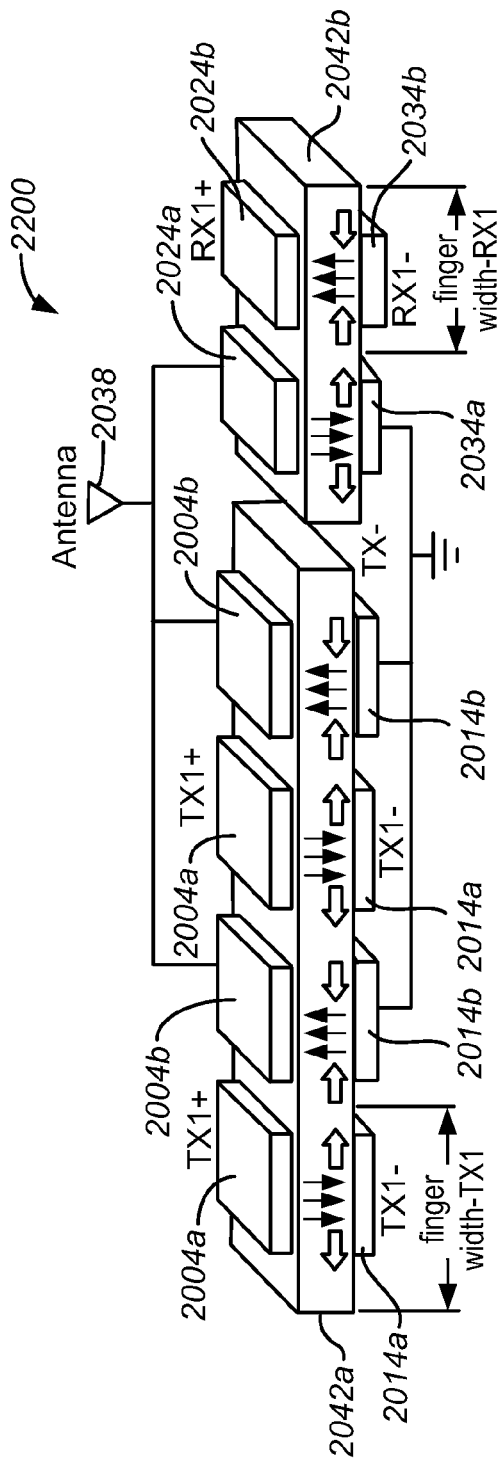
FIG. 22 shows an example of a perspective view of a duplexer system incorporating two or more CMR structures in accordance with yet another implementation.

FIG. 22 shows an example of a perspective view of a duplexer system incorporating two or more CMR structures in accordance with yet another implementation. FIG. 22 shows an alternative duplexer configuration to the devices shown in FIGS. 20A and 20B. Here, the transmission CMR has two or more electrodes 2004a, 2014a, 2004b, and 2014b connected to the respective TX1+, TX1−, antenna, and ground electrodes. For example, CMR 1800 of FIG. 18 could be incorporated on the transmission side of duplexer 2200. This duplexer 2200 can be useful in implementations where the differential inputs and differential outputs have different specifications, such as power handling and motional impedance. In an alternative configuration, the receiver CMR of duplexer 2200, i.e., with electrodes 2024 and 2034 on opposite sides of piezoelectric layer 2042b, is replaced with a similar structure as CMR 1800 of FIG. 18. In the example of FIG. 22, the antenna electrodes 2004b are interdigitated with the TX1+ differential input electrodes 2004a, while ground electrodes 2014b are interdigitated with the TX1− differential input electrodes 2014a. The finger width of electrodes on the transmission CMR, finger width-TX1, can be different from finger width-RX1 on the receiver CMR, and set in accordance with the desired frequencies at which communications are sent and received over antenna 2038.

Figure 23:
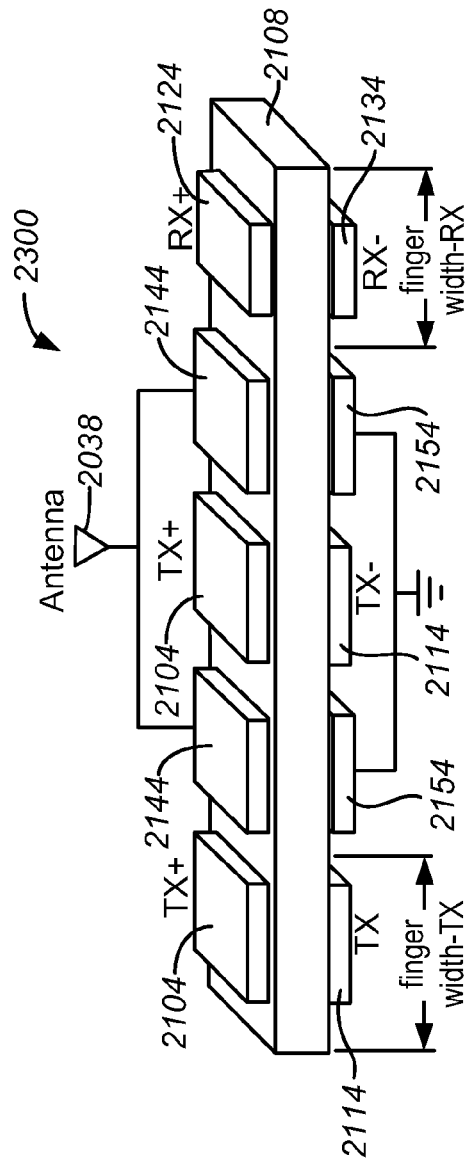
FIG. 23 shows an example of a perspective view of a duplexer system incorporating a CMR structure in accordance with another implementation.

FIG. 23 shows an example of a perspective view of a duplexer system incorporating a CMR structure in accordance with another implementation. FIG. 23 shows an alternative duplexer implementation to FIG. 21, in which the resonators of FIG. 21 are essentially combined, thus providing a compact design. The single CMR structure 2300 is fabricated to have additional differential input electrodes 2104 (TX+) and 2114 (TX−), as well as additional antenna electrodes 2144 and ground electrodes 2154. In this example, the antenna electrodes 2144 are interdigitated with the TX+ differential input electrodes 2104, while ground electrodes 2154 are interdigitated with the TX− differential input electrodes 2114. The resonator structure 2300 can be viewed as a merger of the separate transmission and receiver CMRs of FIG. 22 into a single integral device. Electrodes 2004b and 2024a of FIG. 22 have been combined, as have electrodes 2014b and 2034a. The duplexer 2300 can be useful in implementations where the differential inputs and differential outputs have different power handling and motional impedance specifications. The finger widths of electrodes on the transmission side can be different from the finger widths on the receiver side, and set in accordance with the desired frequencies at which communications are sent and received over antenna 2038.

The structures, devices, apparatus, and systems described above with respect to FIGS. 1-23 may be implemented in any electronic device that is configured to display an image, whether in motion (e.g., video) or stationary (e.g., still image), and whether textual or pictorial. More particularly, it is contemplated that the embodiments may be implemented in or associated with a variety of electronic devices such as, but not limited to, mobile telephones, wireless devices, personal data assistants (PDAs), hand-held or portable computers, GPS receivers/navigators, cameras, MP3 players, camcorders, game consoles, wrist watches, clocks, calculators, television monitors, flat panel displays, computer monitors, auto displays (e.g., odometer display, etc.), cockpit controls and/or displays, display of camera views (e.g., display of a rear view camera in a vehicle), electronic photographs, electronic billboards or signs, projectors, architectural structures, packaging, and aesthetic structures (e.g., display of images on a piece of jewelry).

Figure 24:
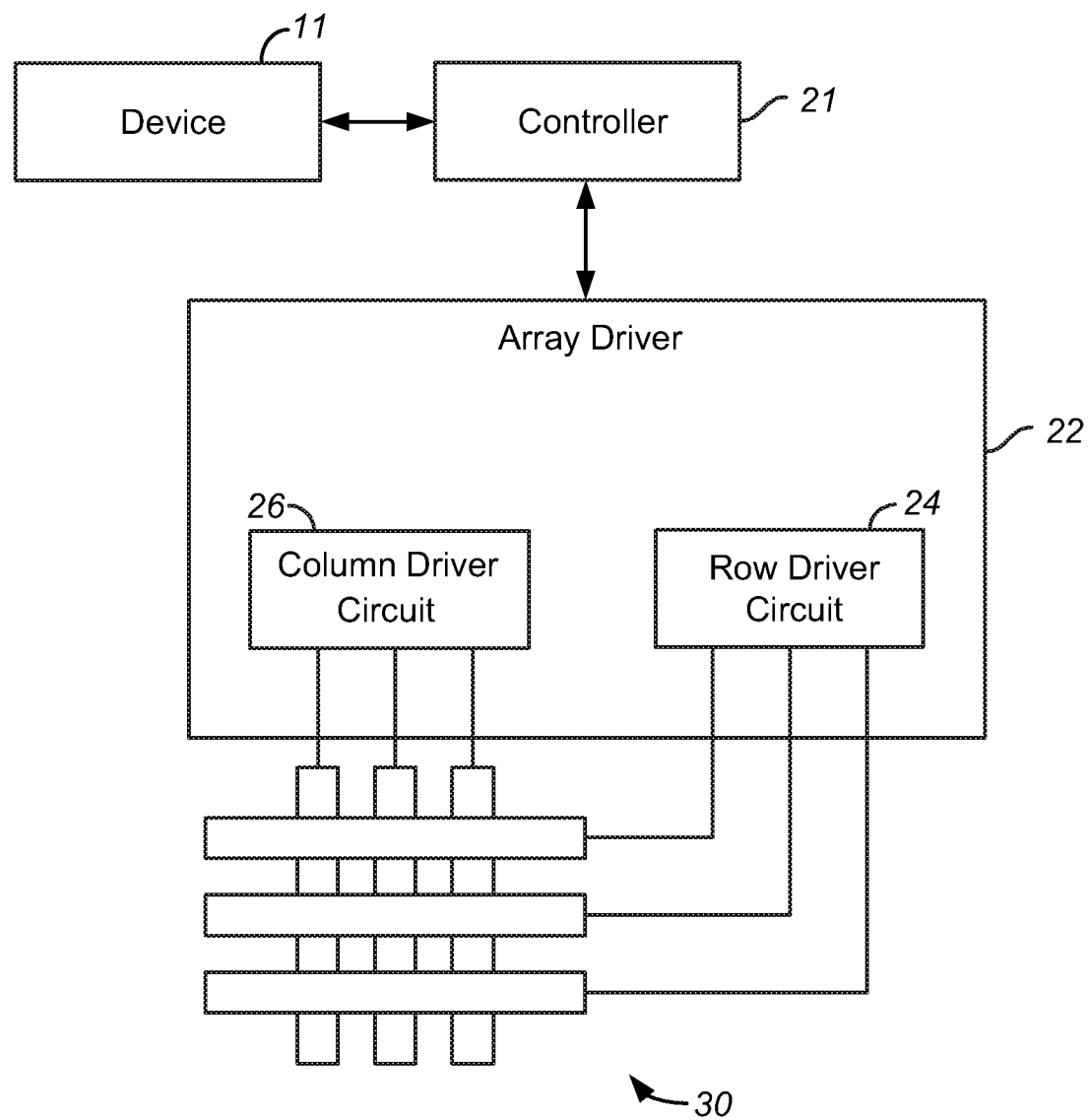
FIG. 24 shows an example of a system block diagram illustrating an electronic device incorporating an interferometric modulator display.

FIG. 24 shows an example of a system block diagram illustrating an electronic device incorporating a 3×3 interferometric modulator (IMOD) display. The electronic device of FIG. 24 represents one implementation in which a resonator device 11 constructed in accordance with the implementations described above with respect to FIGS. 1-23 can be incorporated. The electronic device in which device 11 is incorporated may, for example, form part or all of any of the variety of electrical devices and electromechanical systems devices set forth above, including both display and non-display applications.

Here, the electronic device includes a controller 21, which may include one or more general purpose single- or multi-chip microprocessors such as an ARM®, Pentium®, 8051, MIPS®, Power PC®, or ALPHA®, or special purpose microprocessors such as a digital signal processor, microcontroller, or a programmable gate array. Controller 21 may be configured to execute one or more software modules. In addition to executing an operating system, the controller 21 may be configured to execute one or more software applications, including a web browser, a telephone application, an email program, or any other software application.

The controller 21 is configured to communicate with device 11. The controller 21 can also be configured to communicate with an array driver 22. The array driver 22 can include a row driver circuit 24 and a column driver circuit 26 that provide signals to, e.g., a display array or panel 30. Although FIG. 24 illustrates a 3×3 array of IMODs for the sake of clarity, the display array 30 may contain a very large number of IMODs, and may have a different number of IMODs in rows than in columns, and vice versa. Controller 21 and array driver 22 may sometimes be referred to herein as being "logic devices" and/or part of a "logic system."

Figure 25A:
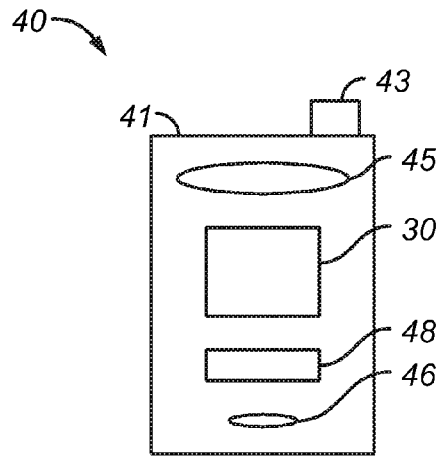
FIGS. 25A and 25B show examples of system block diagrams illustrating a display device that includes a plurality of interferometric modulators.
Figure 25B:
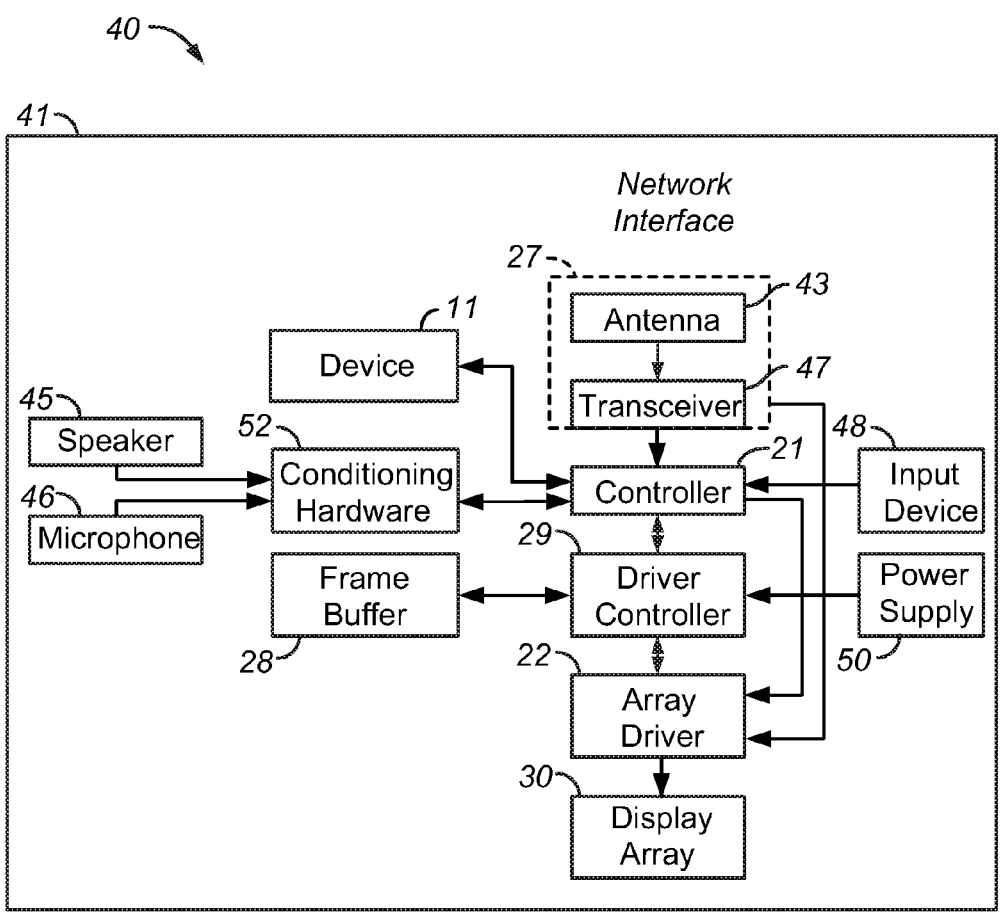

FIGS. 25A and 25B show examples of system block diagrams illustrating a display device 40 that includes a plurality of interferometric modulators. Display device 40 represents one example of an electronic device as described above. The display device 40 can be, for example, a cellular or mobile telephone. However, the same components of the display device 40 or slight variations thereof are also illustrative of various types of display devices such as televisions, e-readers and portable media players.

The display device 40 includes a housing 41, a display 30, an antenna 43, a speaker 45, an input device 48, and a microphone 46. The housing 41 can be formed from any of a variety of manufacturing processes, including injection molding, and vacuum forming. In addition, the housing 41 may be made from any of a variety of materials, including, but not limited to: plastic, metal, glass, rubber, and ceramic, or a combination thereof. The housing 41 can include removable portions (not shown) that may be interchanged with other removable portions of different color, or containing different logos, pictures, or symbols.

The display 30 may be any of a variety of displays, including a bi-stable or analog display, as described herein. The display 30 also can be configured to include a flat-panel display, such as plasma, EL, OLED, STN LCD, or TFT LCD, or a non-flat-panel display, such as a CRT or other tube device. In addition, the display 30 can include an interferometric modulator display, as described herein.

The components of the display device 40 are schematically illustrated in FIG. 25B. The display device 40 includes a housing 41 and can include additional components at least partially enclosed therein. For example, the display device 40 includes a network interface 27 that includes an antenna 43, which is coupled to a transceiver 47. The transceiver 47 is connected to a processor 21, which is connected to conditioning hardware 52. The conditioning hardware 52 may be configured to condition a signal (e.g., filter a signal). The conditioning hardware 52 is connected to a speaker 45 and a microphone 46. The processor 21 is also connected to an input device 48 and a driver controller 29. The driver controller 29 is coupled to a frame buffer 28, and to an array driver 22, which in turn is coupled to a display array 30. A power supply 50 can provide power to all components as required by the particular display device 40 design.

The network interface 27 includes the antenna 43 and the transceiver 47 so that the display device 40 can communicate with one or more devices over a network. The network interface 27 also may have some processing capabilities to relieve, e.g., data processing requirements of the processor 21. The antenna 43 can transmit and receive signals. In some implementations, the antenna 43 transmits and receives RF signals according to the IEEE 16.11 standard, including IEEE 16.11 (a), (b), or (g), or the IEEE 802.11 standard, including IEEE 802.11a, b, g or n. In some other implementations, the antenna 43 transmits and receives RF signals according to the BLUETOOTH standard. In the case of a cellular telephone, the antenna 43 is designed to receive code division multiple access (CDMA), frequency division multiple access (FDMA), time division multiple access (TDMA), Global System for Mobile communications (GSM), GSM/General Packet Radio Service (GPRS), Enhanced Data GSM Environment (EDGE), Terrestrial Trunked Radio (TETRA), Wideband-CDMA (W-CDMA), Evolution Data Optimized (EV-DO), 1xEV-DO, EV-DO Rev A, EV-DO Rev B, High Speed Packet Access (HSPA), High Speed Downlink Packet Access (HSDPA), High Speed Uplink Packet Access (HSUPA), Evolved High Speed Packet Access (HSPA+), Long Term Evolution (LTE), AMPS, or other known signals that are used to communicate within a wireless network, such as a system utilizing 3G or 4G technology. The transceiver 47 can pre-process the signals received from the antenna 43 so that they may be received by and further manipulated by the processor 21. The transceiver 47 also can process signals received from the processor 21 so that they may be transmitted from the display device 40 via the antenna 43. One or more of the resonator structures described above can be incorporated in transceiver 47.

In some implementations, the transceiver 47 can be replaced by a receiver. In addition, the network interface 27 can be replaced by an image source, which can store or generate image data to be sent to the processor 21. The processor 21 can control the overall operation of the display device 40. The processor 21 receives data, such as compressed image data from the network interface 27 or an image source, and processes the data into raw image data or into a format that is readily processed into raw image data. The processor 21 can send the processed data to the driver controller 29 or to the frame buffer 28 for storage. Raw data typically refers to the information that identifies the image characteristics at each location within an image. For example, such image characteristics can include color, saturation, and gray-scale level. Controller 21 is also configured to interact with device 11 to perform desired operations.

The processor 21 can include a microcontroller, CPU, or logic unit to control operation of the display device 40. The conditioning hardware 52 may include amplifiers and filters for transmitting signals to the speaker 45, and for receiving signals from the microphone 46. The conditioning hardware 52 may be discrete components within the display device 40, or may be incorporated within the processor 21 or other components. In one implementation, device 11 is incorporated as a component of conditioning hardware 52.

The driver controller 29 can take the raw image data generated by the processor 21 either directly from the processor 21 or from the frame buffer 28 and can re-format the raw image data appropriately for high speed transmission to the array driver 22. In some implementations, the driver controller 29 can re-format the raw image data into a data flow having a raster-like format, such that it has a time order suitable for scanning across the display array 30. Then the driver controller 29 sends the formatted information to the array driver 22. Although a driver controller 29, such as an LCD controller, is often associated with the system processor 21 as a stand-alone Integrated Circuit (IC), such controllers may be implemented in many ways. For example, controllers may be embedded in the processor 21 as hardware, embedded in the processor 21 as software, or fully integrated in hardware with the array driver 22.

The array driver 22 can receive the formatted information from the driver controller 29 and can re-format the video data into a parallel set of waveforms that are applied many times per second to the hundreds, and sometimes thousands (or more), of leads coming from the display's x-y matrix of pixels.

In some implementations, the driver controller 29, the array driver 22, and the display array 30 are appropriate for any of the types of displays described herein. For example, the driver controller 29 can be a conventional display controller or a bi-stable display controller (e.g., an IMOD controller). Additionally, the array driver 22 can be a conventional driver or a bi-stable display driver (e.g., an IMOD display driver). Moreover, the display array 30 can be a conventional display array or a bi-stable display array (e.g., a display including an array of IMODs). In some implementations, the driver controller 29 can be integrated with the array driver 22. Such an implementation is common in highly integrated systems such as cellular phones, watches and other small-area displays.

In some implementations, the input device 48 can be configured to allow, e.g., a user to control the operation of the display device 40. The input device 48 can include a keypad, such as a QWERTY keyboard or a telephone keypad, a button, a switch, a rocker, a touch-sensitive screen, or a pressure- or heat-sensitive membrane. The microphone 46 can be configured as an input device for the display device 40. In some implementations, voice commands through the microphone 46 can be used for controlling operations of the display device 40.

The power supply 50 can include a variety of energy storage devices as are well known in the art. For example, the power supply 50 can be a rechargeable battery, such as a nickel-cadmium battery or a lithium-ion battery. The power supply 50 also can be a renewable energy source, a capacitor, or a solar cell, including a plastic solar cell or solar-cell paint. The power supply 50 also can be configured to receive power from a wall outlet.

In some implementations, control programmability resides in the driver controller 29 which can be located in several places in the electronic display system. In some other implementations, control programmability resides in the array driver 22. The above-described optimization may be implemented in any number of hardware and/or software components and in various configurations.

The various illustrative logics, logical blocks, modules, circuits and algorithm steps described in connection with the implementations disclosed herein may be implemented as electronic hardware, computer software, or combinations of both. The interchangeability of hardware and software has been described generally, in terms of functionality, and illustrated in the various illustrative components, blocks, modules, circuits and steps described above. Whether such functionality is implemented in hardware or software depends upon the particular application and design constraints imposed on the overall system.

The hardware and data processing apparatus used to implement the various illustrative logics, logical blocks, modules and circuits described in connection with the aspects disclosed herein may be implemented or performed with a general purpose single- or multi-chip processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, or, any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration. In some implementations, particular steps and methods may be performed by circuitry that is specific to a given function.

In one or more aspects, the functions described may be implemented in hardware, digital electronic circuitry, computer software, firmware, including the structures disclosed in this specification and their structural equivalents thereof, or in any combination thereof. Implementations of the subject matter described in this specification also can be implemented as one or more computer programs, i.e., one or more modules of computer program instructions, encoded on a computer storage media for execution by, or to control the operation of, data processing apparatus.

Various modifications to the implementations described in this disclosure may be readily apparent to those skilled in the art, and the generic principles defined herein may be applied to other implementations without departing from the spirit or scope of this disclosure. Thus, the disclosure is not intended to be limited to the implementations shown herein, but is to be accorded the widest scope consistent with the claims, the principles and the novel features disclosed herein. The word "exemplary" is used exclusively herein to mean "serving as an example, instance, or illustration." Any implementation described herein as "exemplary" is not necessarily to be construed as preferred or advantageous over other implementations. Additionally, a person having ordinary skill in the art will readily appreciate, the terms "upper" and "lower" are sometimes used for ease of describing the figures, and indicate relative positions corresponding to the orientation of the figure on a properly oriented page, and may not reflect the proper orientation of the IMOD as implemented.

Certain features that are described in this specification in the context of separate implementations also can be implemented in combination in a single implementation. Conversely, various features that are described in the context of a single implementation also can be implemented in multiple implementations separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the implementations described above should not be understood as requiring such separation in all implementations, and it should be understood that the described program components and systems can generally be integrated together in a single software product or packaged into multiple software products. Additionally, other implementations are within the scope of the following claims. In some cases, the actions recited in the claims can be performed in a different order and still achieve desirable results.

What is claimed is:

1. A contour mode resonator structure comprising:
a first conductive layer including a plurality of first layer electrodes including at least one first electrode capable of receiving a first component of a differential input signal and at least one second electrode capable of providing a first component of a differential output signal, the first layer electrodes being spaced apart along a width of the structure, the at least one first electrode having a first finger width and the at least one second electrode having a different second finger width, each first layer electrode de-coupled from ground;
a second conductive layer including a plurality of second layer electrodes including at least one first electrode capable of receiving a second component of the differential input signal and at least one second electrode capable of providing a second component of the differential output signal, the second layer electrodes being spaced apart along the width of the structure, the at least one first electrode of the second conductive layer having the first finger width and the at least one second electrode of the second conductive layer having the second finger width, each second layer electrode de-coupled from ground; and
a piezoelectric layer between the first conductive layer and the second conductive layer, the piezoelectric layer including a piezoelectric material, the piezoelectric layer substantially oriented in a plane and capable of movement in the plane responsive to an electric field between the at least one first electrode of the first conductive layer and the at least one first electrode of the second conductive layer, or an electric field between the at least one second electrode of the first conductive layer and the at least one second electrode of the second conductive layer.

2. The structure of claim 1, wherein the at least one first electrode of the second conductive layer is capable of receiving a second input signal.

3. The structure of claim 1, wherein the at least one second electrode of the second conductive layer is capable of outputting a second output signal.

4. The structure of claim 1, each electrode being longitudinally oriented along a length of the structure.

5. The structure of claim 1, each electrode having an arced contour shape.

6. The structure of claim 1, the at least one first electrode of the first conductive layer being substantially aligned with the at least one first electrode of the second conductive layer, the at least one second electrode of the first conductive layer being substantially aligned with the at least one second electrode of the second conductive layer.

7. The structure of claim 1, wherein the at least one first electrode of the first conductive layer and the at least one second electrode of the first conductive layer are spaced apart from one another along a width of the structure, and wherein the at least one first electrode of the second conductive layer and the at least one second electrode of the second conductive layer are spaced apart from one another along the width of the structure.

8. The structure of claim 1, wherein the first finger width corresponds to a first resonant frequency of the structure and the second finger width corresponds to a different second resonant frequency of the structure.

9. The structure of claim 1, the piezoelectric material being selected from the group consisting of: aluminum nitride (AlN), zinc oxide (ZnO), gallium arsenide (GaAs), aluminum gallium arsenide (AlGaAs), gallium nitride (GaN), quartz, zinc-sulfide (ZnS), cadmium-sulfide (CdS), lithium tantalite ($LiTaO_3$), lithium niobate ($LiNbO_3$), and lead zirconate titanate (PZT).

10. The structure of claim 1 further comprising:
one or more tethers coupled to anchor the layers to a supporting structure.

11. The structure of claim 1, the piezoelectric layer having a shape selected from the group consisting of a rectangle, a circle, a polygon, a circular annulus, a rectangular annulus, a polygonal annulus and combinations thereof.

12. Apparatus comprising:
the structure of claim 1;
a display;
a processor capable of communicating with the structure of claim 1 and with the display, the processor being capable of processing image data; and
a memory device capable of communicating with the processor.

13. The apparatus of claim 12 further comprising:
a driver circuit capable of sending at least one signal to the display.

14. The apparatus of claim 13 further comprising:
a controller capable of sending at least a portion of the image data to the driver circuit.

15. The apparatus of claim 12, wherein one or both of the at least one second electrode of the first conductive layer and the at least one second electrode of the second conductive layer are capable of sending the image data to the processor.

16. A receiver system comprising:
an antenna configured to receive a wireless signal and to output an antenna signal;
a contour mode resonator structure including:
  a first conductive layer including a first electrode directly connected with the antenna to receive the antenna signal and a second electrode configured to provide a first component of a differential output signal,
  a second conductive layer including a first electrode and a second electrode, the second electrode of the second conductive layer configured to provide a second component of the differential output signal, and
  a piezoelectric layer between the first conductive layer and the second conductive layer, the piezoelectric layer including a piezoelectric material, the piezoelectric layer substantially oriented in a plane and capable of movement in the plane responsive to an electric field between the first electrode of the first conductive layer and the first electrode of the second conductive layer or an electric field between the second electrode of the first conductive layer and the second electrode of the second conductive layer; and
a circuit component including a first input directly connected with the second electrode of the first conductive layer to receive the first component of the differential output signal and a second input directly connected with the second electrode of the second conductive layer to receive the second component of the differential output signal.

17. The system of claim 16, the wireless signal being a radio frequency signal.

18. The system of claim 16, the circuit component including an amplifier.

19. A transmission system comprising:
a circuit component including a first output and a second output, the circuit component configured to output a first component of a differential input signal at the first output and to output a second component of the differential signal at the second output;
a contour mode resonator structure including:
  a first conductive layer including a first electrode directly connected with the first output of the circuit component to receive the first component of the differential input signal and a second electrode configured to provide an output signal,
  a second conductive layer including a first electrode and a second electrode, the first electrode of the second conductive layer directly connected with the second output of the circuit component to receive the second component of the differential input signal, and
  a piezoelectric layer between the first conductive layer and the second conductive layer, the piezoelectric layer including a piezoelectric material, the piezoelectric layer substantially oriented in a plane and capable of movement in the plane responsive to an electric field between the first electrode of the first conductive layer and the first electrode of the second conductive layer or an electric field between the second electrode of the first conductive layer and the second electrode of the second conductive layer; and
an antenna directly connected with the second electrode of the first conductive layer to receive the output signal, the antenna being configured to output a wireless signal.

20. The system of claim 19, the wireless signal being a radio frequency signal.

21. The system of claim 19, the circuit component including an amplifier.

22. A duplexer system comprising:
an antenna; and
a contour mode resonator including:
  a first conductive layer including a plurality of first layer electrodes including a first electrode capable of receiving a first input signal, a second electrode coupled to the antenna, and a third electrode capable of providing a first output signal,
  a second conductive layer including a plurality of second layer electrodes including a first electrode proximate the first electrode of the first conductive layer, a second electrode proximate the second electrode of the first conductive layer, and a third electrode proximate the third electrode of the first conductive layer, the first electrode of the second conductive layer capable of receiving a second input signal, the second electrode of the second conductive layer coupled to ground, and the third electrode of the second conductive layer capable of providing a second output signal, and
  a piezoelectric layer disposed between the first conductive layer and the second conductive layer, the piezoelectric layer including a piezoelectric material, the piezoelectric layer substantially oriented in a plane and capable of movement in the plane responsive to an electric field between the proximate first electrodes of the respective conductive layers, the proximate second electrodes of the respective conductive layers, or the proximate third electrodes of the respective conductive layers.

23. The system of claim 22, a first portion of the first layer electrodes having a first spacing along a width of the structure.

24. The system of claim 23, a second portion of the first layer electrodes having a second spacing along the width of the structure.

25. The system of claim 24, the second spacing being different from the first spacing.

26. The system of claim 24, the first spacing associated with a first resonant frequency of the contour mode resonator, the second spacing associated with a second resonant frequency of the contour mode resonator.

27. A duplexer system comprising:
an antenna including an input configured to receive a first antenna signal and an output configured to provide a second antenna signal;
a first contour mode resonator including:
  a first conductive layer including a plurality of first layer electrodes including a first electrode configured to receive a first component of a differential input signal and a second electrode directly connected with the input of the antenna to provide the first antenna signal to the antenna,
  a second conductive layer including a plurality of second layer electrodes including a first electrode configured to receive a second component of the differential input signal and a second electrode coupled to ground, and a piezoelectric layer between the first conductive layer and the second conductive layer, the piezoelectric layer including a piezoelectric material, the piezoelectric layer substantially oriented in a plane and capable of movement in the plane responsive to an electric field between the first electrode of the first conductive layer and the first electrode of the second conductive layer or an electric field between the second electrode of the first conductive layer and the second electrode of the second conductive layer; and a second contour mode resonator including:
   a first conductive layer including a plurality of first layer electrodes including a first electrode configured to provide a first component of a differential output signal and a second electrode directly connected with the output of the antenna to receive the second antenna signal,
   a second conductive layer including a plurality of second layer electrodes including a first electrode configured to provide a second component of the differential output signal and a second electrode coupled to ground, and
   a piezoelectric layer between the first conductive layer and the second conductive layer, the piezoelectric layer including a piezoelectric material, the piezoelectric layer substantially oriented in a plane and capable of movement in the plane responsive to an electric field between the first electrode of the first conductive layer and the first electrode of the second conductive layer or an electric field between the second electrode of the first conductive layer and the second electrode of the second conductive layer.

28. The system of claim 27, the electrodes of the first contour mode resonator spaced apart from one another along a first width of the piezoelectric layer of the first contour mode resonator, the electrodes of the second contour mode resonator spaced apart from one another along a second width of the piezoelectric layer of the second contour mode resonator.

29. The system of claim 28, the electrodes of the first contour mode resonator having a first finger width corresponding to a first resonant frequency of the first contour mode resonator, the electrodes of the second contour mode resonator having a second finger width corresponding to a second resonant frequency of the second contour mode resonator different than the first resonant frequency.

* * * * *